United States Patent
Nagai et al.

(10) Patent No.: US 8,974,987 B2
(45) Date of Patent: Mar. 10, 2015

(54) PHOTOMASK AND METHODS FOR MANUFACTURING AND CORRECTING PHOTOMASK

(75) Inventors: Takaharu Nagai, Tokyo-to (JP); Hideyoshi Takamizawa, Tokyo-to (JP); Hiroshi Mohri, Tokyo-to (JP); Yasutaka Morikawa, Tokyo-to (JP); Katsuya Hayano, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 13/147,634

(22) PCT Filed: Feb. 4, 2010

(86) PCT No.: PCT/JP2010/051635
§ 371 (c)(1), (2), (4) Date: Aug. 3, 2011

(87) PCT Pub. No.: WO2010/092901
PCT Pub. Date: Aug. 19, 2010

(65) Prior Publication Data
US 2011/0294045 A1    Dec. 1, 2011

(30) Foreign Application Priority Data
Feb. 16, 2009 (JP) .................. 2009-033216
Sep. 9, 2009 (JP) .................. 2009-207682

(51) Int. Cl.
*G03F 1/32* (2012.01)
*G03F 1/00* (2012.01)
(Continued)

(52) U.S. Cl.
CPC *G03F 1/32* (2013.01); *G03F 1/144* (2013.01); *G03F 1/36* (2013.01); *G03F 1/0076* (2013.01); *G03F 1/0092* (2013.01); *G03F 1/72* (2013.01)
USPC .................................................. 430/5

(58) Field of Classification Search
CPC .................................... G03F 1/28; G03F 1/32
USPC .......................................................... 430/5
See application file for complete search history.

(56) References Cited

U.S. PATENT DOCUMENTS

| | | | |
|---|---|---|---|
| 5,780,208 A | * | 7/1998 | Ziger et al. .................. 430/394 |
| 5,786,113 A | | 7/1998 | Hashimoto et al. |

(Continued)

FOREIGN PATENT DOCUMENTS

| | | |
|---|---|---|
| JP | 03-089346 A | 4/1991 |
| JP | 07-140639 A | 6/1995 |

(Continued)

OTHER PUBLICATIONS

Neal V. Lafferty, et al; "Gray Assist Bar OPC", Optical Microlithography XVII, Proc. of SPIE, 2004, vol. 5377, pp. 381-392.
(Continued)

*Primary Examiner* — Stephen Rosasco
(74) *Attorney, Agent, or Firm* — Ladas & Parry LLP

(57) ABSTRACT

The present invention provides a halftone mask comprising an assist pattern and a manufacturing method of the halftone mask, which uses an ArF excimer laser as an exposing source, is used for a projection exposure by an off axis illumination, does not resolve the assist pattern while keeping the focal depth magnification effect as the assist pattern, and may form a transferred image having high contrast of a main pattern. A photomask is a photomask comprising the main pattern which is transferred to a transfer-target surface by the projection exposure and the assist pattern which is formed nearby the main pattern and not transferred, characterized in that the main pattern and the assist pattern are each constituted from a semi-transparent film made of the same material, a retardation of 180° is generated between the light transmitting through the main pattern and the light transmitting through a transparent region of a transparent substrate, and a predetermined retardation within the scope of 70° to 115° is generated between the light transmitting through the assist pattern and the light transmitting through the transparent region of the transparent substrate.

12 Claims, 21 Drawing Sheets

(51) Int. Cl.
    *G03F 1/36*     (2012.01)
    *G03F 1/72*     (2012.01)

(56) References Cited

U.S. PATENT DOCUMENTS

| | | | |
|---|---|---|---|
| 2002/0006554 A1* | 1/2002 | Fischer et al. | 430/5 |
| 2002/0137361 A1 | 9/2002 | Kim et al. | |
| 2004/0161678 A1* | 8/2004 | Misaka | 430/5 |
| 2007/0082275 A1 | 4/2007 | Chang | |
| 2007/0238032 A1* | 10/2007 | Murano | 430/5 |
| 2008/0261124 A1 | 10/2008 | Saito | |

FOREIGN PATENT DOCUMENTS

| | | |
|---|---|---|
| JP | 09-073166 A | 3/1997 |
| JP | 10-123692 A | 5/1998 |
| JP | 11-202475 A | 7/1999 |
| JP | 2003-195481 A | 7/2003 |
| JP | 2003-302739 A | 10/2003 |
| JP | 2005-044843 A | 2/2005 |
| JP | 2005-157022 A | 6/2005 |
| JP | 2007-018005 A | 1/2007 |
| JP | 2007-305972 A | 11/2007 |
| JP | 2008-122722 A | 5/2008 |
| JP | 2008-158499 A | 7/2008 |
| JP | 2008-304737 A | 12/2008 |
| KR | 20040070805 A | 8/2004 |
| KR | 100618811 B1 | 8/2006 |

OTHER PUBLICATIONS

International Search Report: mailed Mar. 9, 2010, PCT/JP2010/051635.
European Search Report dated Aug. 6, 2013; EP10 74 1178.
Extended European Search Report dated May 15, 2014; Appln. No. 14000706.3-1564/2738791.

\* cited by examiner

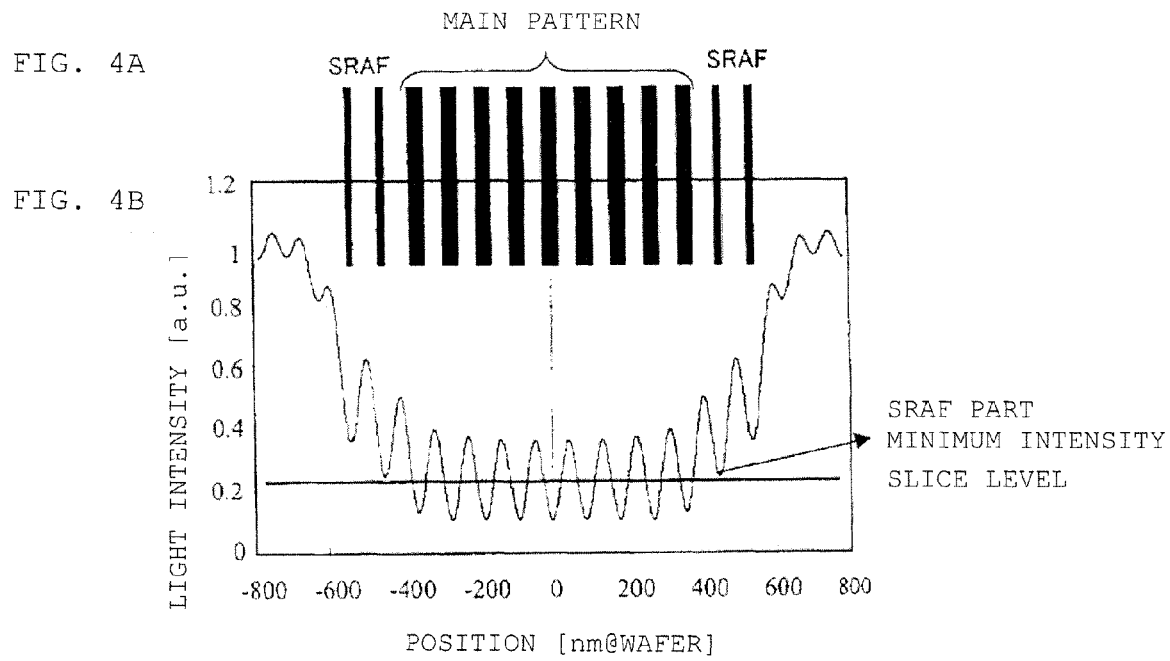
FIG. 4A
FIG. 4B
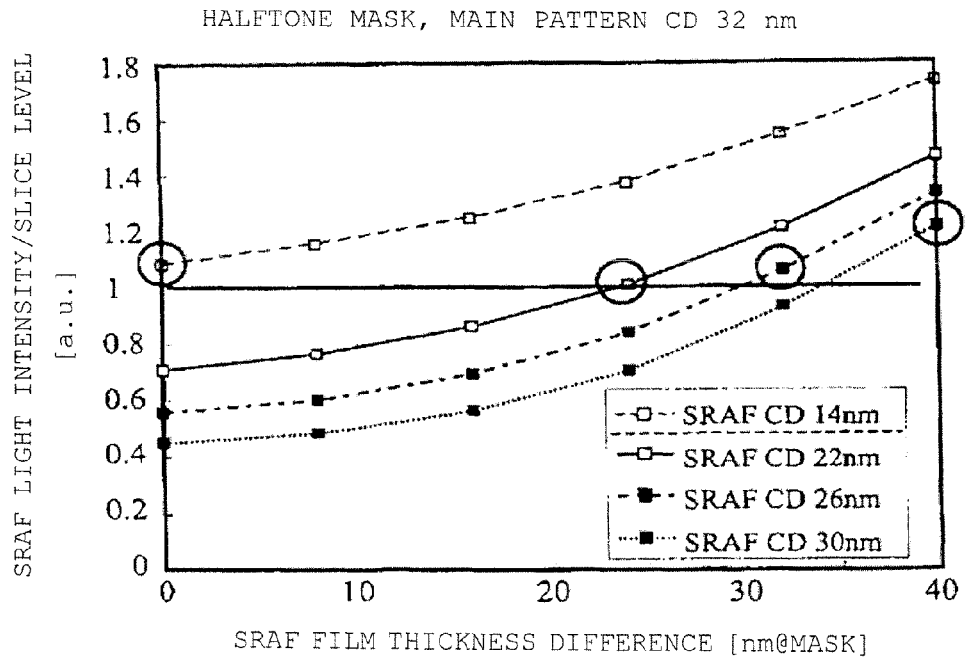
FIG. 5

FIG. 23
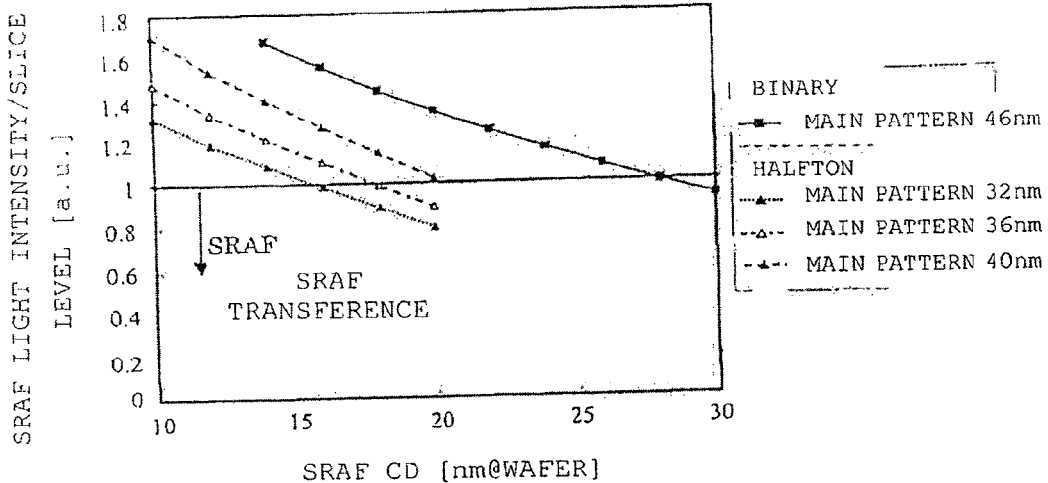
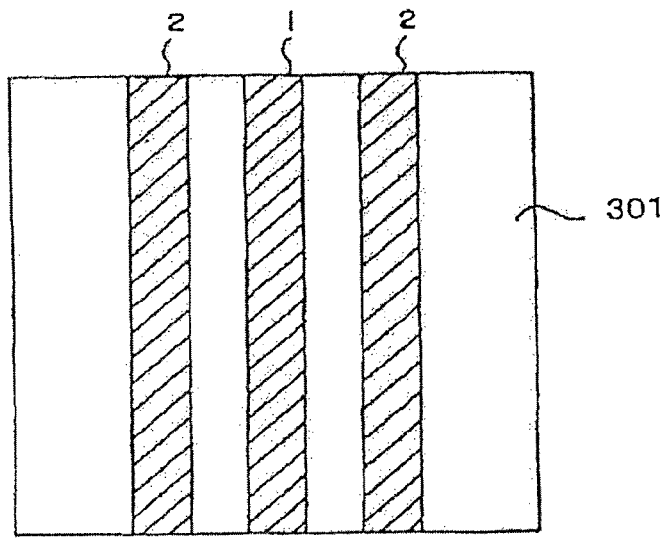
FIG. 24A
--PRIOR ART--
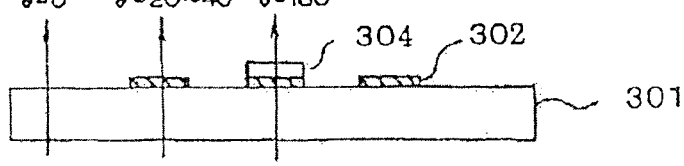
FIG. 24B
--PRIOR ART--

FIG. 27  SEM PHOTOGRAPH OF SRAF PART AFTER
BEING FORMED INTO THIN FILM
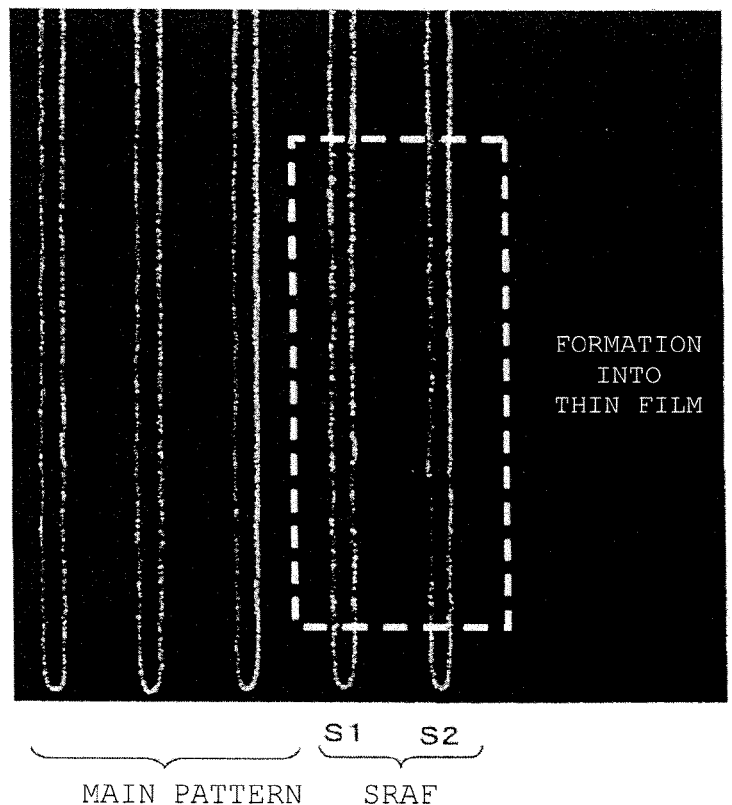
MAIN PATTERN   S1 S2
                SRAF
FIG. 28  AIMS IMAGE OF SRAF PART AFTER
BEING FORMED INTO THIN FILM

PATTERN POSITION [μm@WAFER]

PATTERN POSITION [μm@WAFER]

PHOTOMASK AND METHODS FOR MANUFACTURING AND CORRECTING PHOTOMASK

TECHNICAL FIELD

The present invention relates to a photomask and a manufacturing method of the photomask, which is used for a photolithographic technique using a shortwave exposing source such as an excimer laser exposure device used for patterning a semiconductor device, and a correcting method of the photomask and the corrected photomask, and particularly relates to a halftone photomask and a manufacturing method of the halftone photomask, in which an assist pattern is disposed nearby a main pattern, and a correcting method of the photomask and the corrected photomask.

BACKGROUND ART

In order to realize high integration and ultramicronization of a semiconductor device developing from a half pitch of 65 nm into 45 nm and further 32 nm, a high-NA technique for increasing the numeric aperture of a projector lens, an immersion exposure technique for exposing while making a high-refraction medium intervene between a projector lens and an exposure target, and an off axis illumination-mounted exposure technique have been put to practical use as a high-resolution technique in an exposure device in photolithography.

Phase shifting masks such as a Levenson (also referred to as Shibuya-Levenson) phase shifting mask for improving resolution by a phase shifting effect utilizing optical interference, a halftone phase shifting mask (simply referred to as a halftone mask hereinafter) constituted from a part for transmitting light and a part for semi-transmitting light, and a chromeless phase shifting mask including no light shielding layers such as chrome have been used as measures to improve resolution in a photomask (also referred to as a mask hereinafter) used for photolithography, together with micronization and high precision of a conventional binary mask constituted from a part for transmitting light and a part for shielding light.

In a photolithographic technique, the minimum dimension (resolution) transferable by a projection exposure device is in proportion to a wavelength of light used for exposure and is in inverse proportion to the numeric aperture (NA) of a lens in a projection optical system, so that shorter wavelength of exposing light and higher NA of a projection optical system have been progressing in accordance with a request for micronization of a semiconductor device; however, it has become a limit to make only shorter wavelength and higher NA satisfy this request.

Thus, a super-resolution technique for intending micronization by decreasing a value of process constant $k_1$ ($k_1$=resolution line width×numeric aperture of projection optical system/wavelength of exposing light) has been proposed for improving resolution in recent years. Methods called a method of optimizing a mask pattern by providing an assist pattern and a line width offset for the mask pattern in accordance with the properties of an exposure optical system, or a method by an off axis illumination (also referred to as an oblique-incidence illumination method) are offered as such a super-resolution technique. An annular illumination (also referred to as Annular) using a pupil filter, a dipolar illumination using a dipolar (also referred to as Dipole) pupil filter, and a quadrupole illumination using a quadrupole (also referred to as Cquad) pupil filter are ordinarily used for projection exposure by an off axis illumination.

The method using an assist pattern is a lithographic method using a photomask having the effect of improving resolution and focal depth of a main pattern by disposing a pattern (referred to as an assist pattern hereinafter), which is a resolution limit or less of a projection optical system and not transferred on a wafer, nearby a pattern (referred to as a main pattern hereinafter), which is transferred on a wafer (for example, refer to Patent Literature 1). The assist pattern is also called SRAF (Sub Resolution Assist Feature) (the assist pattern is also referred to as SRAF hereinafter in the present invention).

However, in accordance with micronization of a semiconductor device pattern, a photomask having an assist pattern has had difficulty in producing the mask. First, as described above, the difficulty is conceived to be such that the assist pattern itself needs not to be imaged on a wafer and needs to be minuter in dimension than a main pattern. As a result, in accordance with micronization of the main pattern dimension, the line width dimension of the assist pattern to be requested is micronized from several hundreds nm to such a minuter dimension as to be approaching a limit in producing. For example, in the case of forming a semiconductor device of a 65-nm line width on a wafer, the line width dimension of the main pattern on the mask (a reticle with an ordinary tetraploid pattern) is formed into approximately 200 nm to 400 nm in addition to optical proximity correction (OPC), while the line width dimension of the assist pattern becomes 120 nm or less and the mask production becomes extremely difficult. As described above, the dimension of the assist pattern is a great problem in producing the mask on the exposure conditions of transferring a pattern with a half pitch of 65 nm or less.

In addition, with regard to transfer properties of the mask on which a pattern with a half pitch of 65 nm or less is transferred, as described later, a halftone mask allows more favorable transferred image than a binary mask so frequently that it is greatly desired that the mask having the assist pattern is constituted into a halftone mask and a halftone mask having the assist pattern is also proposed (for example, refer to Patent Literature 2, Patent Literature 3 and Non Patent Literature 1). However, a halftone mask ordinarily has a minus bias in the mask pattern dimension by reason of transfer properties, so that it is requested that the dimension of the assist pattern formed from a semi-transparent film as a halftone mask is smaller than the dimension of the assist pattern of a binary mask formed from only a light shielding film. In a generation from 45 nm to 32 nm of a half pitch of a semiconductor device, the assist pattern dimension of 60 nm or less in mask line width has been requested, depending on the design and exposure conditions of a semiconductor.

Also, in accordance with micronization of the assist pattern, in a mask production process such as washing, or in the case of rewashing a mask which became dirty during using in an exposure device, with regard to a halftone mask including a conventional assist pattern, an aspect ratio (pattern height/pattern width) of the assist pattern approaches 1 and the problem is to cause phenomena such that part of the assist pattern is chipped, the assist pattern is peeled off a substrate surface, and the assist pattern falls in the line width direction.

A photomask, in which a retardation of 180° is generated between the light transmitting through a semi-transparent pattern and the light transmitting through a transparent region of a transparent substrate, a predetermined retardation within the scope of 50° or less is generated between the light transmitting through a semi-transparent assist pattern and the light transmitting through a transparent region of a transparent substrate, and focus properties of the semi-transparent pattern are flattened, is proposed in Patent Literature 2 as correspondence to micronization of the assist pattern by a halftone mask. FIGS. 24A and 24B are a plan view (FIG. 24A) and a longitudinal cross-sectional view (FIG. 24B) of a photomask described in Patent Literature 2. The photomask according to Patent Literature 2 allows an assist pattern provided nearby a line pattern as a main pattern to be also formed into the same dimension as the main pattern.

The halftone mask having the assist pattern described in Patent Literature 2, as shown in FIGS. 24A and 24B, is a mask such that a semi-transparent pattern as a main pattern 1 is a line pattern with a line width of 0.3 μm on a wafer and a semi-transparent assist pattern 2 is a line pattern with the same line width as the main pattern 1 on the right and left thereof. In this mask, the main pattern 1 has a two-layer constitution such that a transparent film 304 is further formed on a semi-transparent film 302, a retardation of 180° is generated between the light transmitting through the semi-transparent main pattern 1 formed from the two-layer film and the light transmitting through a transparent region of a transparent substrate 301, on the other hand, a predetermined retardation within the scope of 50° or less is generated between the light transmitting through the semi-transparent assist pattern 2 and the light transmitting through a transparent region of the transparent substrate 301, and focus properties of the semi-transparent pattern are flattened.

CITATION LIST

Patent Literature

Patent Literature 1: Japanese Patent Application Publication No. H07-140639
Patent Literature 2: Japanese Patent No. 2953406
Patent Literature 3: Japanese Patent Application Publication No. 2003-302739

Non Patent Literature

Non Patent Literature 1: N. V. Lafferty, et al., Proc. of SPIE Vol. 5377, 381-392 (2004)

SUMMARY OF INVENTION

Technical Problem

However, the halftone mask having the assist pattern described in Patent Literature 2 is a mask of a generation intended for a semiconductor device in which an i line (365 nm) of a mercury-vapor lamp or a KrF excimer laser (248 nm) is used for an exposing source, the numeric aperture NA of a projection optical system is as small as 0.6, and the pattern dimension on a wafer is of a submicronic order of 0.3 to 0.35 μm; in the case of being used as a mask for a semiconductor device in which an ArF excimer laser presently proceeding toward practical use is used as an exposing source, an exposure device such that NA is as high as 1 or more, desirably approximately 1.3 to 1.35 is used, and the pattern dimension on a wafer is a half pitch of 65 nm or less, further 45 nm and 32 nm, the problem is as follows.

That is to say, according as process constant $k_1$ becomes small, an off axis illumination is used for improving resolution of the main pattern, and the problem is that the assist pattern is easily resolved accordingly. In addition, the problem is caused such that the assist pattern is easily resolved on a transfer-target surface by reason of a steric effect by the thickness of a mask in a vertical direction to the mask substrate plane (a three-dimensional effect of a mask) through oblique-incidence irradiation of an off axis illumination. With regard to the halftone mask having the assist pattern described in Patent Literature 2, even though retardation of the main pattern is within a predetermined scope, the assist pattern is resolved by the three-dimensional effect, and change in dimension becomes asymmetric with respect to defocus; the problem is caused such that the quality of a transferred image deteriorates to be inappropriate for practical use.

Also, with regard to any of the photomasks described in Patent Literature 2, Patent Literature 3 and Non Patent Literature 1, only the main pattern has a two-layer constitution such that a semi-transparent film is superposed on a lower layer of a transparent substrate side, and a light shielding film or a semi-transparent film or a transparent film made of a material different from the lower layer is superposed on an upper layer thereof. In the production of a photomask having the assist pattern of a semi-transparent film, a film-forming process of the main pattern needs to be performed twice and the problem is that a production process becomes complicated. In addition, in the production of a photomask described in Patent Literature 2, the problem is that the alignment of a first pattern formed on a transparent substrate with a second pattern formed subsequently becomes difficult in accordance with pattern micronization, a space between the main pattern and the assist pattern needs to be determined at a value in consideration of misalignment (ordinarily, approximately 200 nm) or more, and the equalization of the assist pattern width with the main pattern width becomes difficult in accordance with pattern micronization.

As described above, although the halftone mask including the assist pattern has been greatly requested in accordance with micronization of a semiconductor device pattern, a photomask including a conventional assist pattern does not correspond to micronization as a mask for a semiconductor device with a half pitch of 65 nm or less, further 45 nm and 32 nm, and the problem is that the production thereof becomes difficult.

Thus, the present invention has been made in view of the above-mentioned problems. That is to say, a first object of the present invention is to provide a halftone mask having an assist pattern and a manufacturing method thereof, which mask uses an ArF excimer laser as an exposing source, is a mask used for a projection exposure by an off axis illumination, does not resolve the assist pattern while keeping the focal depth magnification effect as the assist pattern, restrains chipping and falling of the assist pattern, and may form a transferred image having high contrast of a main pattern.

Also, as described above, in accordance with micronization of the assist pattern, in a mask production process such as washing, or in the case of rewashing a mask which became dirty during using in an exposure device, the problem is that part of the assist pattern is chipped.

Thus, the present invention has been made in view of the above-mentioned problems. That is to say, a second object of the present invention is to provide a halftone mask having an assist pattern, which mask restrains chipping of the assist pattern from occurring.

Originally, the assist pattern is designed as a mask so as not to be resolved on a transfer-target surface, so that all of the plural assist patterns are not necessarily transferred; yet, the problem is caused such that part of the assist pattern, for example, the assist pattern nearby a main pattern or part of the nearby assist pattern is resolved.

Various factors such as the case where the precision of mask design software is so poor as to bring imperfection in a mask design stage, the case where the error of the assist pattern dimension actually produced is large, the case where an optical system of a semiconductor exposure device has a subtle error, and the problems in the properties of a semiconductor resist are conceived as the cause for the above-mentioned assist pattern or part thereof to be resolved on a transfer-target surface.

As described above, although the photomask including the assist pattern has been greatly requested, pattern transfer is performed in a region close to the limit of a minute pattern in accordance with micronization of a semiconductor device pattern, so that the problem is caused such that the assist pattern is resolved on a transfer-target surface after exposure transfer; even in attempting not to be resolved by correcting the assist pattern line width to a smaller value for correcting the mask of the assist pattern to be transferred, it is difficult to correct the assist pattern of, for example, 60 nm or less in mask line width to a smaller width, and the problem is that the photomask needs to be produced again.

Thus, the present invention has been made in view of the above-mentioned problems. That is to say, a third object of the present invention is to provide a correcting method of a photomask and the corrected photomask, which method corrects an assist pattern by a sure and comparatively easy method with regard to the photomask in the case where the assist pattern is resolved on a transfer-target surface in the photomask which uses an ArF excimer laser as an exposing source and has the assist pattern used for a projection exposure by an off axis illumination.

Solution to Problem

To solve the above-mentioned problems, the present invention provides a photomask using an ArF excimer laser as an exposing source, being used for a projection exposure by an off axis illumination, and comprising on a principal plane of a transparent substrate a main pattern transferred to a transfer-target surface by the projection exposure and an assist pattern formed nearby the main pattern and not transferred to the transfer-target surface; characterized in that the main pattern and the assist pattern are each constituted from a semi-transparent film made of the same material; and a retardation of 180° is generated between a light transmitting through the main pattern and a light transmitting through a transparent region of the transparent substrate, and a predetermined retardation within a scope of 70° to 115° is generated between a light transmitting through the assist pattern and a light transmitting through a transparent region of the transparent substrate.

In the above-mentioned invention, preferably, a film thickness of the assist pattern is thinner than a film thickness of the main pattern, and a film thickness difference is a predetermined film thickness difference within a scope of 24 nm to 40 nm.

In the above-mentioned invention, the film thickness difference is preferably formed by dry-etching.

In the above-mentioned invention, an exposing light transmittance of the assist pattern is preferably a predetermined transmittance within a scope of 15% to 29%.

In the above-mentioned invention, the semi-transparent film made of the same material is preferably a single-layer semi-transparent film or a two-layer semi-transparent film.

In the above-mentioned invention, preferably, the single-layer semi-transparent film is a semi-transparent film made of a molybdenum silicide-based material, and the two-layer semi-transparent film is such that a semi-transparent film made of a chromium-based material and a semi-transparent film made of a molybdenum silicide-based material are sequentially provided on the transparent substrate.

In the above-mentioned invention, a light shielding region is preferably formed in an outer periphery of the photomask.

In the above-mentioned present invention, preferably, the above-mentioned single-layer semi-transparent film is a semi-transparent film made of a molybdenum silicide-based material and the above-mentioned two-layer semi-transparent film is such that a semi-transparent film made of a chromium-based material and a semi-transparent film made of a molybdenum silicide-based material are sequentially provided on the above-mentioned transparent substrate.

In the above-mentioned present invention, preferably, both the main pattern and the assist pattern are line patterns, and the main pattern is an isolated pattern or a periodic pattern.

Furthermore, the present invention provides a manufacturing method of a photomask using an ArF excimer laser as an exposing source, being used for a projection exposure by an off axis illumination, and comprising on a principal plane of a transparent substrate a main pattern transferred to a transfer-target surface by the projection exposure and an assist pattern formed nearby the main pattern and not transferred to the transfer-target surface; characterized by comprising steps of:

(a) forming a semi-transparent film and a light shielding film sequentially on the principal plane of the transparent substrate to obtain a film thickness for allowing a retardation of approximately 180° between a light transmitting through the semi-transparent film and a light transmitting through a transparent region of the transparent substrate;

(b) forming a first resist pattern on the light shielding film to form a main pattern part and an assist pattern part by sequentially dry-etching the light shielding film and the semi-transparent film;

(c) peeling off the first resist pattern to subsequently form a second resist pattern on the light shielding film and removing the light shielding film from the assist pattern part by etching;

(d) peeling off the second resist pattern to subsequently dry-etch the whole principal plane of the transparent substrate and forming the assist pattern by dry-etching the semi-transparent film of the assist pattern part until a film thickness for allowing a predetermined retardation within a scope of 70° to 115° is obtained between a light transmitting through the assist pattern and the light transmitting through the transparent region of the transparent substrate; and (e) removing the light shielding film of the main pattern part by etching to form the main pattern and generate a retardation of 180° between a light transmitting through the main pattern and the light transmitting through the transparent region of the transparent substrate.

In the above-mentioned present invention, the dry-etching of the semi-transparent film in the step (d) is half-etching up to a halfway stage of a film thickness of the semi-transparent film.

Furthermore, the present invention provides a manufacturing method of a photomask using an ArF excimer laser as an exposing source, being used for a projection exposure by an off axis illumination, and comprising on a principal plane of a transparent substrate a main pattern transferred to a transfer-target surface by the projection exposure and an assist pattern formed nearby the main pattern and not transferred to the transfer-target surface; characterized by comprising steps of:

(a) forming a semi-transparent film and a light shielding film sequentially on the principal plane of the transparent substrate, in which the semi-transparent film is a two-layer semi-transparent film and a lower-layer semi-transparent film on the transparent substrate side serves also as an etch stop layer of an upper-layer semi-transparent film, to obtain a film thickness for allowing a retardation of approximately 180° between a light transmitting through the two-layer semi-transparent film and a light transmitting through a transparent region of the transparent substrate;

(b) forming a first resist pattern on the light shielding film to form a main pattern part and an assist pattern part by sequentially dry-etching the light shielding film and the two-layer semi-transparent film;

(c) peeling off the first resist pattern to subsequently form a second resist pattern on the light shielding film and removing the light shielding film from the assist pattern part by etching;

(d) peeling off the second resist pattern to subsequently dry-etch the whole principal plane of the transparent substrate and forming the assist pattern by dry-etching the semi-transparent film of the assist pattern part until a film thickness for allowing a predetermined retardation within a scope of 70° to 115° is obtained between a light transmitting through the assist pattern and the light transmitting through the transparent region of the transparent substrate; and (e) removing the light shielding film of the main pattern part by etching to form the main pattern and generate a retardation of 180° between a light transmitting through the main pattern and the light transmitting through the transparent region of the transparent substrate.

In the above-mentioned present invention, a film thickness difference between a first thickness of the main pattern and a second thickness of the assist pattern is preferably a predetermined film thickness difference within a scope of 24 nm to 40 nm.

In the above-mentioned present invention, the manufacturing method preferably comprises a step of forming a resist pattern for a light shielding region to form a light shielding region in an outer periphery of the photomask after the step (d) of forming the assist pattern, and the light shielding region is formed at the same time of removing the light shielding film from the main pattern by dry-etching to form a main pattern.

Furthermore, the present invention provides a photomask comprising on a principal plane of a transparent substrate a main pattern transferred to a transfer-target surface by a projection exposure and an assist pattern formed nearby the main pattern and not transferred to the transfer-target surface; characterized in that the main pattern and the assist pattern are each constituted from a semi-transparent film made of the same material; and a film thickness of the assist pattern is thinner than a film thickness of the main pattern, and a film thickness difference is a predetermined film thickness difference within a scope of 24 nm to 40 nm.

Furthermore, the present invention provides a correcting method of a photomask using an ArF excimer laser as an exposing source, being used for a projection exposure by an off axis illumination, and comprising on a principal plane of a transparent substrate a main pattern transferred to a transfer-target surface by the projection exposure and an assist pattern formed nearby the main pattern, in the case where the assist pattern is resolved on the transfer-target surface by the projection exposure; characterized in that a surface of the assist pattern to be resolved is etched or ground to thin a film thickness of the assist pattern to be resolved until the assist pattern is not resolved on the transfer-target surface.

In the above-mentioned present invention, a film thickness difference between a film thickness of the assist pattern after being corrected by etching or grinding to thin and a film thickness of the assist pattern before being corrected is preferably within a scope of 1 nm to 40 nm.

In the above-mentioned present invention, preferably, the etching is a gas-assisted etching by using an electron beam of an electron beam mask correcting device, and the grinding is a grinding by using a probe of an atomic force microscope.

In the above-mentioned present invention, preferably, the main pattern and the assist pattern are each constituted from a semi-transparent film, and a film thickness of the main pattern is film thickness for generating a retardation of 180° between a light transmitting through the main pattern and a light transmitting through a transparent region of the transparent substrate.

In the above-mentioned present invention, preferably, the main pattern is constituted from a light shielding film, and the assist pattern is constituted from a semi-transparent film.

In the above-mentioned present invention, that the main pattern and the assist pattern are preferably each constituted from a light shielding film.

In the above-mentioned present invention, preferably, both the main pattern and the assist pattern are line patterns, and the main pattern is an isolated pattern or a periodic pattern.

In the above-mentioned present invention, preferably, the assist pattern is corrected by the correcting method of a photomask, and the film thickness of the assist pattern after being corrected is thinner than the film thickness of the assist pattern before being corrected.

Advantageous Effects of Invention

According to a photomask of the present invention, in a halftone mask having an assist pattern, the formation of only the assist pattern part into a thin film allows a transferred image having high contrast to be formed while keeping the focal depth magnification effect as the assist pattern. Even though the assist pattern dimension is enlarged from 56 nm to 104 nm, the assist pattern part is not resolved and the focal depth magnification effect of a main pattern at a repetition end is not influenced badly and the assist pattern dimension may be enlarged to approximately twice the conventional dimension; the decreasing of an aspect ratio of the assist pattern produces the effect of restraining chip and falling of the assist pattern. Also, with regard to a photomask of the present invention, mask blanks for a halftone mask conventionally used may be directly used therefor in the case where a semi-transparent film is a single layer; the mask blanks material does not need to be modified, so that compatibility of the mask blanks may be secured in contrast to a halftone mask using no assist pattern, and quality maintenance of the mask and reduction of mask costs become feasible.

According to a manufacturing method of a photomask of the present invention, a main pattern and an assist pattern are each constituted from a semi-transparent film made of the same material, so that a film-forming process of the semi-transparent film is easy; mask blanks for a halftone mask conventionally used may be directly used therefor in the case where the semi-transparent film is a single layer, and the mask blanks material does not need to be modified, so that mask production costs may be reduced. A space between the main pattern and the assist pattern is widened so more by making the assist pattern width smaller than the main pattern as to allow a manufacturing method having a high margin of the misalignment of a first pattern formed on a transparent substrate with a second pattern formed subsequently, and allow a photomask for improving transfer properties of the pattern without increasing difficulty in mask production.

According to a photomask of the present invention, the determination of film thickness difference between a main pattern and an assist pattern at a predetermined scope allows phenomena to be restrained from occurring such that part of the assist pattern is chipped, the assist pattern is peeled off from a substrate surface, and the assist pattern falls in the line width direction.

According to a correcting method of a photomask of the present invention, in a correcting method of a photomask in the case where an assist pattern which may not originally be transferred to a transfer-target surface is resolved on a transfer-target surface, a surface of the assist pattern to be resolved is etched or ground to thin the film thickness of the assist pattern until the assist pattern is not resolved on a transfer-target surface, so that a problem such that the assist pattern is transferred may be solved to correct to a photomask for forming a transferred image having high contrast while keeping the focal depth magnification effect as the assist pattern. The correcting method of a photomask of the present invention differs from a correction of the assist pattern in the line width direction as a conventional method, is a correcting method of forming the assist pattern in the thickness direction into a thin film, and allows the photomask having the assist pattern to be securely corrected by an easy method.

According to a photomask by a correcting method of the present invention, with regard to the photomask in which an assist pattern is transferred to a transfer-target surface, the assist pattern is corrected in the thickness direction, so that the assist pattern is not transferred to a transfer-target surface and the effect of allowing a high-quality photomask for forming a transferred image having high contrast while having the focal depth magnification effect is produced.

BRIEF DESCRIPTION OF DRAWINGS

FIG. 3A is a plan schematic view of Cquad, and FIG. 3B is a perspective schematic view in irradiating the mask with exposing light by using Cquad.

FIGS. 4A and 4B are an evaluation pattern used in a halftone mask (or a photomask having an assist pattern) of the present invention, and a view of an aerial image showing a relation between a position of the evaluation pattern and light intensity.

FIG. 5 is a view showing a relation between SRAF film thickness difference and SRAF light intensity/slice level in changing CD of SRAF.

FIG. 23 is a view showing a ratio of SRAF part light intensity to slice level of light intensity threshold with respect to SRAF CD on a wafer in conventional halftone mask and binary mask.

FIGS. 24A and 24B are a plan view and a longitudinal cross-sectional view of a photomask having a conventional semi-transparent assist pattern described in Patent Literature 2.

FIG. 27 is an SEM photograph of an SRAF part after being formed into a thin film by a test sample in Examples.

FIG. 28 is an image showing a planar state of light intensity distribution on a wafer by a lithographic simulation microscope after partially etching an SRAF part in a test sample.

DESCRIPTION OF EMBODIMENTS

A. Photomask

Figure 1:
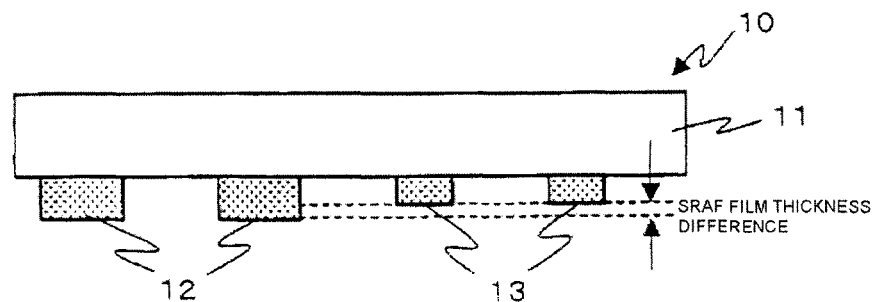
FIG. 1 is a partial cross-sectional schematic view showing an embodiment of a halftone mask having an assist pattern of the present invention.

A photomask of the present invention is a mask which uses an ArF excimer laser as an exposing source, is used for a projection exposure by an off axis illumination, and is preferably intended to be used for forming a minute semiconductor device with a half pitch of 65 nm or less, further 45 nm and 32 nm on a wafer.

(Transfer Properties of Conventional Halftone Mask)

The transfer properties of a halftone mask having an assist pattern as a target of the present invention are first described before describing the present invention. The inventors of the present invention have examined the transfer properties of a halftone mask having an assist pattern for forming a minute pattern with a half pitch of 45 nm or less on a wafer by simulation while comparing with a binary mask by using a conventional halftone mask.

Conventionally, the evaluation of the transfer properties of a mask pattern has been predicted by a method of mainly expressing the planar properties of the mask pattern with transmittance and retardation. In recent years, indices such as contrast or NILS (Normalized Image Log-Slope) and MEEF (Mask Error Enhancement Factor) have been used for evaluating the transfer properties of a photomask. First, the transfer properties of the mask were evaluated by using NILS and MEEF.

NILS is represented by the following expression (1). A larger value of NILS brings a steeper optical image and improved dimension controllability of a resist pattern. Generally, NILS is preferably 2 or more, and a resist process to be resolved even at an NILS of approximately 1.5 or more has been requested in accordance with micronization of a semiconductor device. Here, W is a desired pattern dimension, $I_{th}$ is a light intensity threshold for allowing W, and (dI/dx) is a slope of an aerial image.

$$\text{NILS}=(dI/dx)/(W \times I_{th}) \quad (1)$$

MEEF is represented by the following expression (2) and shown by a ratio of a pattern dimension change amount on a wafer (Δ wafer CD) to a mask dimension change amount (Δ mask CD). CD shows an important dimension (Critical Dimension) of a mask and a wafer. A numerical value 4 of the expression (2) is a contraction ratio of a mask and exemplifies the case of using a general quadruple mask. As shown by the expression (2), a smaller value (nearby 1) of MEEF allows a mask pattern to be transferred to a wafer pattern more accurately; a smaller value of MEEF improves a wafer production yield and consequently also a mask production yield used for the wafer production.

$$\text{MEEF}=\Delta\text{wafer CD}/\Delta\text{mask CD}/4 \quad (2)$$

Figure 3A:
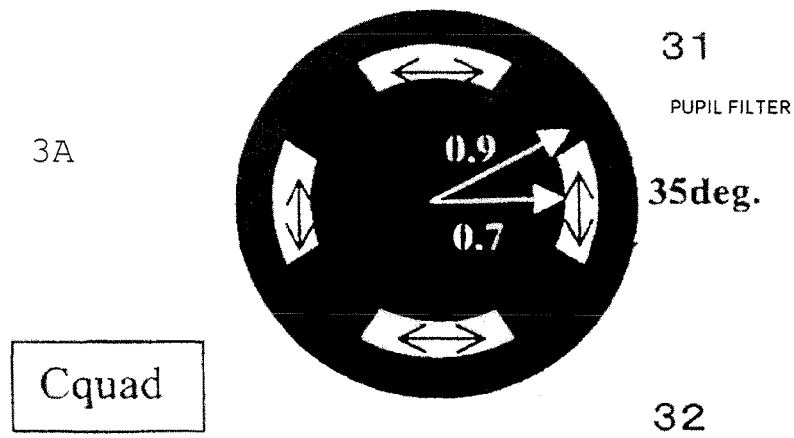
FIGS. 3A and 3B show a Cquad pupil filter used for evaluating a halftone mask (or a photomask having an assist pattern) of the present invention.
Figure 3B:
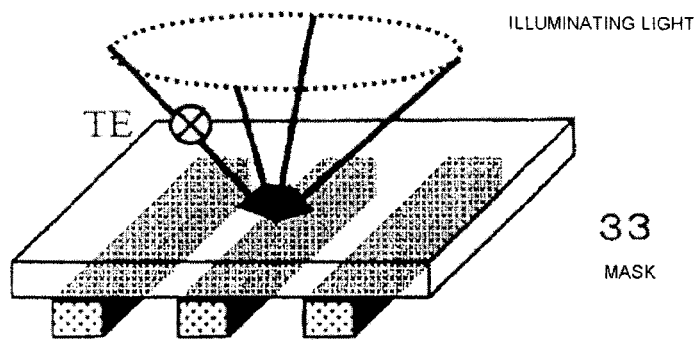

In the present invention, EM-Suite (trade name, manufactured by Panoramic Technology Inc.) was used as simulation software for estimating the transfer properties of a mask pattern. The main simulation conditions were such that an ArF excimer laser (193 nm) was used as an illuminating source, NA was 1.35, and a Cquad pupil filter 31 shown in FIGS. 3A and 3B was used as an off axis illumination. FIG. 3A is a plan schematic view of the Cquad 31, and FIG. 3B is a perspective schematic view in irradiating a mask 33 with exposing light by using the Cquad 31. The Cquad 31 was such that an angular aperture of a fan-shaped light transmission part was 35°, an outside diameter was 0.9, and an inside diameter was 0.7 (a radius of the pupil filter is regarded as 1). A conventional general molybdenum silicide-based halftone mask with a transmittance of 6% in an exposure wavelength of 193 nm (referred to as 6%-halftone) and a molybdenum silicide-based binary mask for comparison were used as the mask 33. A target line dimension on a wafer was 45 nm, and the pattern was a line/space repetition pattern with a pitch of 90 nm (a half pitch of 45 nm).

Figure 20:
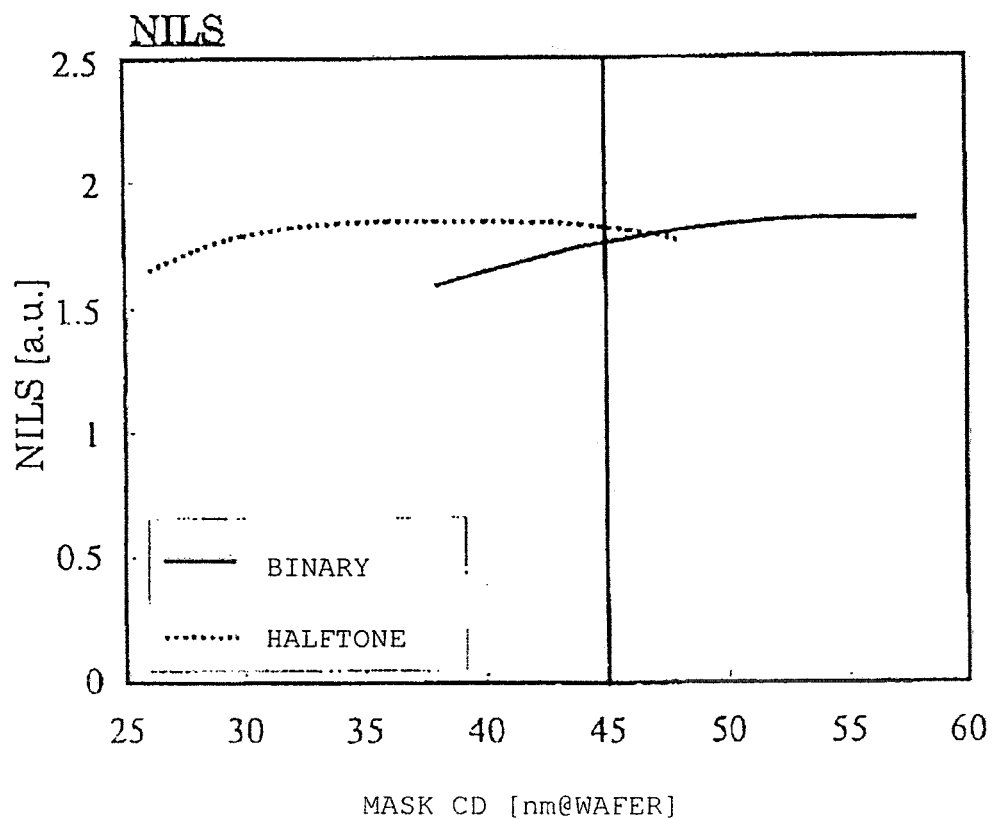
FIG. 20 shows a relation between mask CD and NILS in conventional halftone mask and binary mask.
Figure 21:
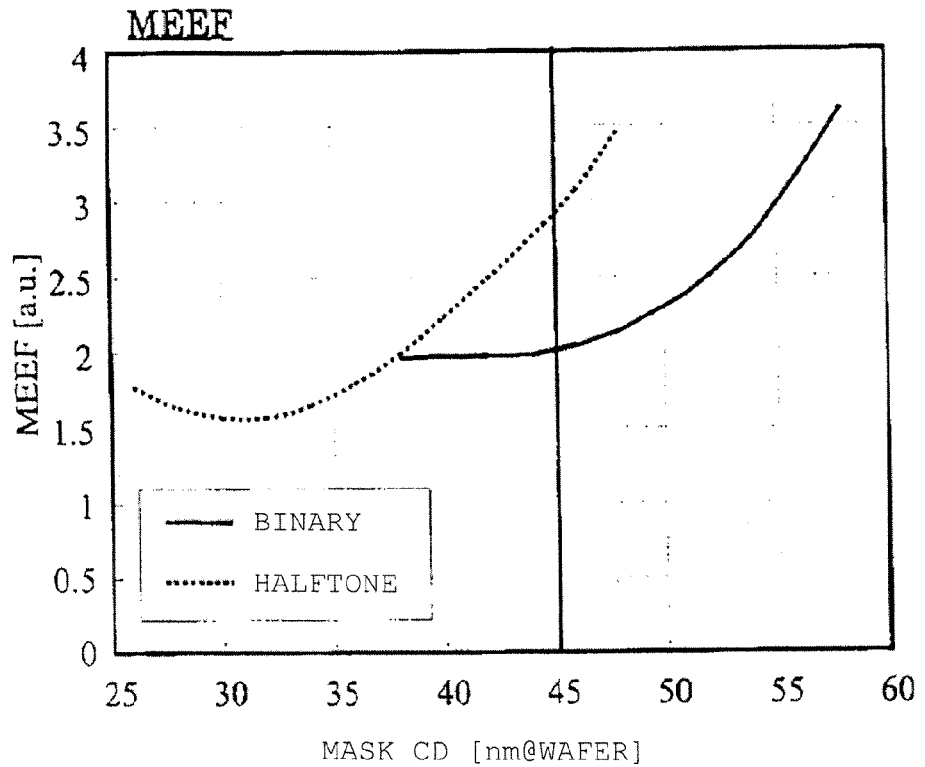
FIG. 21 shows a relation between mask CD and MEEF in conventional halftone mask and binary mask.

FIGS. 20 and 21 are views showing a relation between a mask bias and transfer properties in a transfer-target dimension of 45 nm on a wafer obtained by the above-mentioned simulation in conventional halftone mask and binary mask; FIGS. 20 and 21 show a relation of mask CD to NILS and MEEF, respectively, In NILS shown in FIG. 20, with regard to the halftone mask, NILS shows the maximum value in a mask CD of 32 nm to 44 nm (on a wafer), in which a line pattern dimension is thinned by determining a mask bias at the minus side. On the other hand, with regard to the binary mask, the more a line pattern dimension is thickened by determining a mask bias at the plus side, the more NILS tends to increase.

In MEEF shown in FIG. 21, with regard to both the halftone mask and the binary mask, the more a line pattern dimension is thinned by determining a mask bias at the minus side, the more MEEF decreases; it is more preferable that the halftone mask offers a smaller value than the binary mask.

Through FIGS. 20 and 21, with regard to the halftone mask, the mask CD of the maximum NILS and the minimum MEEF corresponds approximately. On the other hand, with regard to the binary mask, NILS and MEEF are in a reciprocal relation and it is found that when one property is improved, the other property is deteriorated. This fact shows that the halftone mask is more appropriate than the binary mask for forming a pattern with a half pitch of 45 nm or less. Accordingly, as described in the present invention, it is one of preferable choices to use the halftone mask as a photomask for forming a pattern with a half pitch of 45 nm or less.

Figure 22:
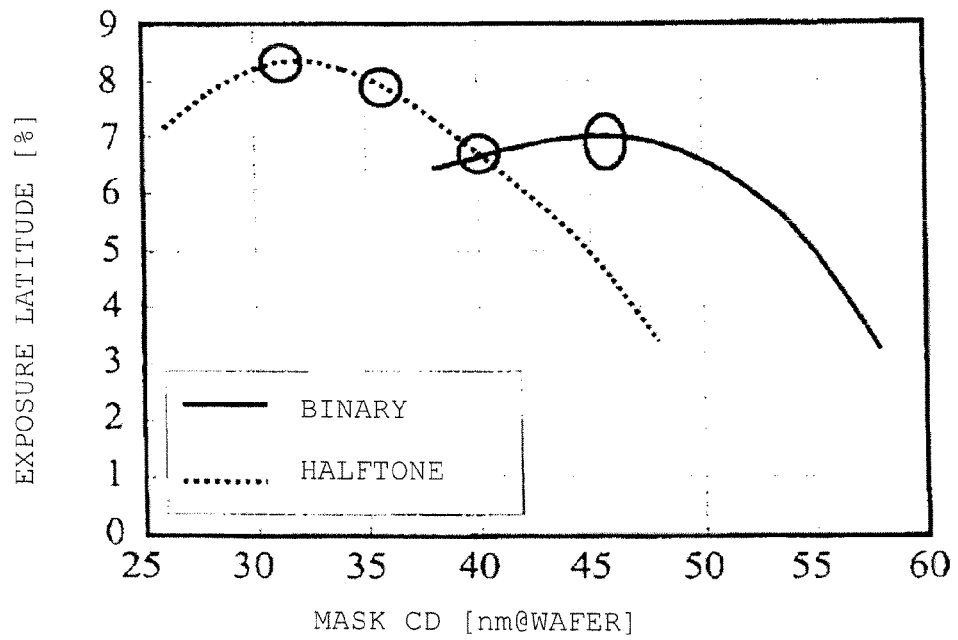
FIG. 22 is a view showing mask CD and exposure latitude in conventional halftone mask and binary mask.

FIG. 22 is a view showing mask CD and Exposure Latitude (also referred to as exposure tolerance) of conventional halftone mask and binary mask. The exposure latitude is a value showing exposure margin for obtaining favorable resist dimension and shape. Here, the exposure latitude was evaluated on the conditions that the error of wafer transfer CD became ±3.8 nm or less in the case where a focal plane was shifted within the scope of ±50 nm and main pattern mask CD was shifted within the scope of ±2.5 nm. Here, mask CD is converted onto a wafer and mask CD of the main pattern to be transferred is shown. In FIG. 22, the halftone mask (a dotted line in the FIG.) offers the best exposure latitude of 8.3% when mask CD is 32 nm, and offers the same exposure latitude as the binary mask (a solid line) when mask CD is 40 nm. On the other hand, the binary mask offers the best exposure latitude of 7% when mask CD is 46 nm; however, the exposure latitude is smaller as compared with the halftone mask.

FIGS. 4A and 4B show an evaluation pattern used in the present invention (FIG. 4A), and a view of an aerial image showing light intensity corresponding to a position of the evaluation pattern (FIG. 4B). The evaluation pattern is regarded as a pair including nine line/space with a half pitch of 45 nm as the main pattern and two SRAF (the half pitch of SRAF is the same as the main pattern) at both ends of the main pattern for improving resolution of the main pattern at the ends, and is a repetition pattern holding a space of 400 nm therebetween. Both the main pattern and SRAF are the above-mentioned 6%-halftone.

Next, in a halftone mask having an assist pattern, transfer properties of the assist pattern (SRAF) at the ends of the line/space pattern are described. In FIGS. 4A and 4B, the horizontal axis shows a position of the main pattern and a pair of the pattern of SRAF, and the vertical axis shows normalized light intensity when light intensity of a transmission part with no patterns is regarded as 1; slice level shown by a horizontal solid line in the drawing is normalized light intensity threshold. The slice level varies with the dimension of the main mask pattern. The case where the minimum light intensity of an SRAF part shown by an arrow in the drawing becomes lower than the slice level signifies that SRAF is resolved on a wafer.

FIG. 23 is a view showing a ratio (the vertical axis) of SRAF part light intensity to slice level of normalized light intensity threshold with respect to SRAF CD (the horizontal axis) on a wafer in a halftone mask and a binary mask in the case of making the film thickness constant on the basis of prior art. The halftone mask (a triangular point in the FIG.) shows the case where the main pattern CD is of three kinds (32 nm; 36 nm; and 40 nm on a wafer). The above-mentioned ratio of 1 or less causes SRAF to be transferred, so that the above-mentioned ratio needs to be 1 or more for not transferring SRAF. When the main pattern CD of the halftone mask shown by a dotted line in the drawing is 32 nm (128 nm on the mask), the above-mentioned exposure latitude exhibits the best value; however, if SRAF CD is not 14 nm (56 nm on the mask) or less, SRAF is resolved to find the mask production difficult.

The above is a simulation result in the case of using a conventional 6%-halftone mask having SRAF, and is found excellent in mask properties in the simulation; yet, the SRAF dimension becomes so extremely small that the actual mask production is difficult.

(Photomask of the Present Invention)

Next, embodiments of a photomask and a manufacturing method of the photomask of the present invention are described in detail on the basis of drawings while referring to the above-mentioned results. In the present invention, except for the case where SRAF is between the after-mentioned main patterns, in describing transfer properties of the following mask pattern, a Cquad pupil filter 31 shown in the above-mentioned FIGS. 3A and 3B was used and EM-Suite (trade name, manufactured by Panoramic Technology Inc.) was used as simulation software. The main simulation conditions are such that an ArF excimer laser (193 nm) is used as an illuminating source and NA is 1.35. The pattern shown in the above-mentioned FIG. 4A is used for an evaluation pattern.

First Embodiment

FIG. 1 is a partial cross-sectional schematic view showing a first embodiment of a halftone mask having an assist pattern as a photomask of the present invention, exemplifies the case where a line/space pattern is provided. FIG. 1 is a halftone mask 10 in which a main pattern 12 is provided on a transparent substrate 11 such as a synthetic quartz substrate by a single-layer semi-transparent film for transmitting exposing light at a predetermined transmittance to change a phase, and an assist pattern (SRAF) 13 composed of a single-layer semi-transparent film made of the same material as the main pattern 12 is formed nearby the main pattern 12. FIG. 1 exemplifies only two lines of the main pattern 12 and the assist pattern 13 each and part of a mask pattern, and needless to say, is not limited thereto. The main pattern may be an isolated pattern or a periodic pattern.

The halftone mask 10 having an assist pattern of the present invention is determined so that a retardation of 180° is generated between the light transmitting through the main pattern 12 and the light transmitting through a transparent region with no patterns of the transparent substrate 11, and a predetermined retardation within the scope of 70° to 115° is generated between the light transmitting through the assist pattern 13 and the light transmitting through a transparent region of the transparent substrate 11. The determination of retardations of the main pattern 12 and the assist pattern 13 as described above allows the halftone mask 10 not to resolve the assist pattern 13 while keeping the focal depth magnification effect as the assist pattern, and to form a transferred image having high contrast of the main pattern 12.

In order to generate the above-mentioned retardations, with regard to the halftone mask 10 having the assist pattern of the present invention, the film thickness of the assist pattern 13 is thinner than the film thickness of the main pattern 12, and the film thickness difference (hereinafter referred to as SRAF film thickness difference) is determined at a predetermined film thickness difference within the scope of 24 nm to 40 nm. The above-mentioned predetermined film thickness difference may be formed by selectively dry-etching an SRAF part.

With regard to the halftone mask 10 having the assist pattern, for example, when ArF exposing light transmittance of the main pattern for generating a retardation of 180° is 6%, ArF exposing light transmittance of the assist pattern for generating the above-mentioned predetermined retardation within the scope of 70° to 115° is a predetermined transmittance within the scope of 15% to 29%.

A material for a semi-transparent film composing the main pattern 12 and the assist pattern 13 of the halftone mask 10 of the present invention shown in FIG. 1 is not particularly limited and examples thereof include semi-transparent films such as a molybdenum silicide oxide film (MoSiO), a molybdenum silicide nitride film (MoSiN) and a molybdenum silicide oxide nitride film (MoSiON), which are molybdenum silicide-based materials. The molybdenum silicide-based semi-transparent films are put to practical use as a halftone mask material and are more preferable materials.

A conventionally known method may be applied to the formation of the semi-transparent film 12; for example, a molybdenum silicide oxide film (MoSiO) may be formed into a thickness of several tens of nm by a reactive sputtering method in a mixed gas atmosphere of argon and oxygen with the use of a mixed target (Mo:Si=1:2% by mol) of molybdenum and silicon.

In the case where the semi-transparent film composing the main pattern 12 and the assist pattern 13 is a semi-transparent film made of molybdenum silicide-based materials, a pattern may be formed by dry-etching with the use of fluorine-based gas such as $CF_4$, $CHF_3$ and $C_2F_6$, or mixed gas thereof, or alternatively a gas, with which oxygen is mixed, as etching gas.

Here, in the case where the semi-transparent film is a single layer of molybdenum silicide-based materials, ordinarily the transparent substrate surface also is slightly etched and dug in on the occasion of dry-etching the semi-transparent film to form a mask pattern (not shown in FIG. 1). In the present invention, the digging depth of the transparent substrate surface of a part with no mask patterns is preferably controlled to a depth within the scope of 0 to 10 nm. A digging depth of more than 10 nm brings no good influence on mask properties. Thus, in a halftone mask of the present invention, the etching depth of the transparent substrate surface is controlled to a predetermined depth within the scope of 0 to 10 nm to previously determine retardation including this depth. In the following embodiments, the digging depth of any halftone mask to be etched is determined at 4 nm, and it is needless to say that another etching depth may be used if it is within the scope of 0 to 10 nm.

For example, in the case where molybdenum silicide with a film thickness of 68 nm is used as the semi-transparent film, a halftone mask of the embodiments may be such that the main pattern (a film thickness of 68 nm) has ArF excimer laser light transmittance of 6% and a retardation of 180° with a transparent region of the transparent substrate, and the assist pattern has a predetermined film thickness difference within the scope of 24 nm to 40 nm with the main pattern and a predetermined retardation within the scope of 70° to 115° with a transparent region of the transparent substrate.

Second Embodiment

Figure 2:
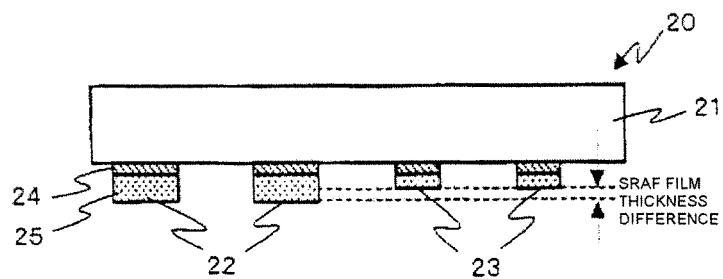
FIG. 2 is a partial cross-sectional schematic view showing another embodiment of a halftone mask having an assist pattern of the present invention.

In order to decrease the above-mentioned digging of the transparent substrate surface, a halftone mask composed of a two-layer semi-transparent film shown in FIG. 2 is shown as another embodiment of a photomask of the present invention. A main pattern and an assist pattern are composed of a two-layer semi-transparent film made of the same material, and a lower-layer semi-transparent film 24 on the transparent substrate side has the function of an etch stop layer during dry-etching of an upper-layer semi-transparent film 25 and also has the function as a semi-transparent film. Examples of the upper-layer semi-transparent film 25 include the above-mentioned molybdenum silicide-based materials. In this case, the lower-layer semi-transparent film 24 is preferably a chromium oxide film (CrO), a chromium nitride film (CrN) and a chromium oxide nitride film (CrON), which are chromium-based materials. The reason therefor is that a thin film made of the above-mentioned chromium-based materials is semi-transparent against exposing light and resistant to fluorine-based gas used for dry-etching molybdenum silicide-based materials. The chromium-based materials are formed by a conventionally known reactive sputtering method, and a thin film made of the chromium-based materials in an unwanted part may be dry-etched by chlorine-based gas and does not damage the transparent substrate. The upper-layer semi-transparent film 25 and the lower-layer semi-transparent film 24 are formed into films with a thickness of several tens nm and several nm to several tens nm, respectively.

With regard to a halftone mask of the present invention, in the above-mentioned first and second embodiments, a light shielding region may be formed in the outer periphery of the mask. Ordinarily, the mask outer periphery is subject to multiple exposure in a projection exposure on a semiconductor wafer, so that a photomask provided with a light shielding region in the mask outer periphery is used. Accordingly, also in the present invention, a light shielding film is provided on a semi-transparent film in a desired region such as the outer periphery to allow a light shielding region. The light shielding film is formed as a light shielding region in such a manner that a metal film such as chromium having light shielding property is formed into a thickness of approximately several tens nm to 200 nm and patterned.

(Transfer Properties of Assist Pattern)

Next, the effect of thin-film forming for an assist pattern (SRAF) of a halftone mask of the present invention shown in FIG. 1 is described. FIG. 5 is a view showing a relation between SRAF film thickness difference (the horizontal axis) and SRAF light intensity/slice level of normalized light intensity threshold (the vertical axis) in changing CD of SRAF in a halftone mask such that CD of a main pattern on a wafer is 32 nm. It is shown that SRAF is resolved on a wafer unless SRAF light intensity/slice level is 1 or more.

As shown in FIG. 5, when CD of SRAF is as minute as 14 nm (56 nm on a mask), SRAF is not transferred even though SRAF film thickness difference is 0, namely, the same as the film thickness (68 nm) of the main pattern. When CD of SRAF is 22 nm (88 nm on a mask), SRAF is not resolved and transferred if SRAF film thickness difference is 24 nm or more. Similarly, when CD of SRAF is 26 nm (104 nm on a mask), SRAF is not transferred if SRAF film thickness difference is 30 nm or more, and when CD of SRAF is 30 nm (120 nm on a mask), SRAF is not transferred if SRAF film thickness difference is 34 nm or more.

As described in the above-mentioned FIG. 23, in a halftone mask such that conventional main pattern and assist pattern (SRAF) are composed of the same material and the same film thickness, when CD of the main pattern is determined at 32 nm, SRAF is used only if CD of SRAF is 14 nm or less; however, as described above, the use of SRAF of the present invention, which is formed into a thin film, allows SRAF to be used without being resolved and transferred even though CD of SRAF is enlarged to approximately twice the conventional dimension, that is, 26 nm to 30 nm. SRAF may be easily formed into a thin film by selectively dry-etching an SRAF part. The SRAF dimension may be enlarged to approximately twice the conventional dimension, so that a halftone mask having SRAF made of the same material, which is conventionally difficult to be micronized and used, may be used.

Figure 6:
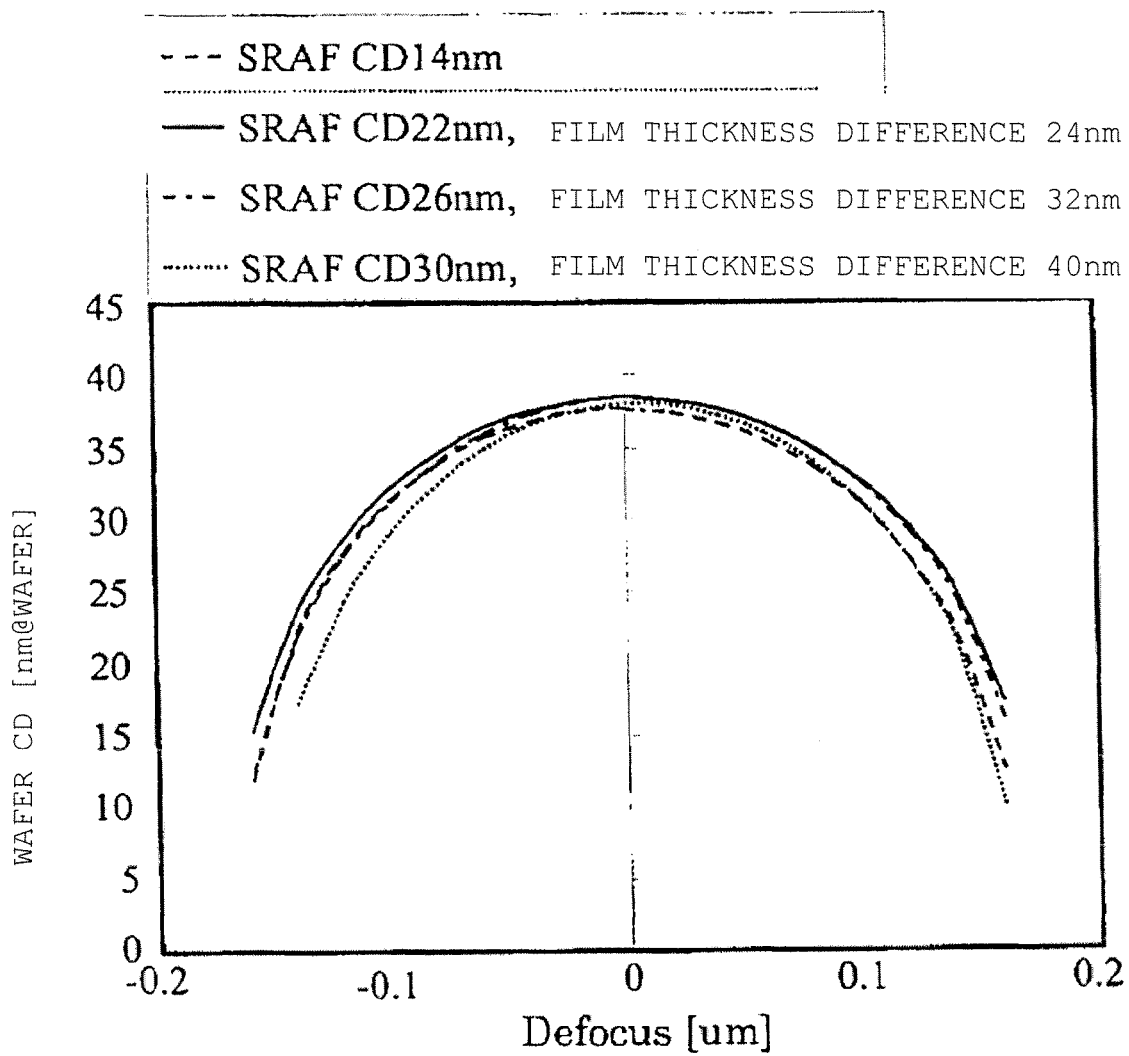
FIG. 6 is a view showing a relation between line CD and Defocus at a main pattern end on a wafer in changing CD of SRAF.

FIG. 6 is a view showing a relation between line CD and Defocus (focal position change) at a main pattern end on a wafer in changing CD of SRAF. A predetermined film thickness difference (24 nm, 32 nm and 40 nm) with film thickness of the main pattern is offered by etching so that SRAF is not resolved with respect to each CD of SRAF. As shown in FIG. 6, CD of SRAF is enlarged to 22 nm to 30 nm to thin the film thickness of SRAF, so that approximately the same tendency is exhibited without any CD change among each of SRAF dimensions when the focus is changed. That is to say, the formation of SRAF into a thin film has no bad influence on Defocus to allow the same dimensional accuracy.

As described above, with regard to a photomask of the present invention, the formation of only the assist pattern part into a thin film allows a transferred image having high contrast to be formed while keeping the focal depth magnification effect as the assist pattern. In addition, the assist pattern dimension may be enlarged to approximately twice the conventional dimension; the decreasing of an aspect ratio of the assist pattern allows the effect of reducing chip and falling of the assist pattern. Also, in the case where a molybdenum silicide-based single-layer film is used as a photomask of the present invention, mask blanks for a halftone mask conventionally used may be directly used; the mask quality is maintained to allow a mask having a high-precision minute pattern to be used.

B. Manufacturing Method of Photomask

Next, a manufacturing method of a photomask of the present invention is described. As described above, the photomask of the present invention is characterized in that a predetermined retardation within the scope of 70° to 115° is generated between the light transmitting through the assist pattern and the light transmitting through the transparent region of the transparent substrate; in order to generate the above-mentioned retardation in the assist pattern, the film thickness of the assist pattern is so thinner than the film thickness of the main pattern as to allow a predetermined film thickness difference within the scope of 24 nm to 40 nm. Examples of a method of allowing a predetermined film thickness difference include a method of changing film thickness to be formed in accordance with a pattern during the formation of a semi-transparent film, and a method of changing film thickness by etching a semi-transparent film in accordance with a pattern after the formation of the semi-transparent film. The manufacturing method of a photomask of the present invention is based on the latter etching method for offering easy production to allow a high-precision mask.

(Conventional Manufacturing Method of Photomask)

The problems in the case of producing a photomask of the present invention by using a publicly known general manufacturing method are described before describing a manufacturing method of a photomask of the present invention, and subsequently a manufacturing method of a photomask of the present invention is described.

Figure 11A:
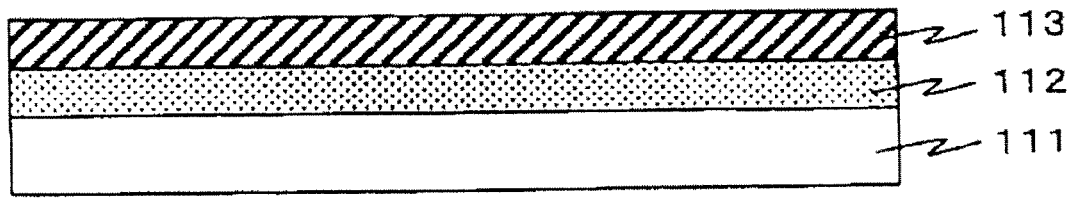
FIGS. 11A to 11E are a process cross-sectional schematic view showing an embodiment of a manufacturing method of a conventional photomask.
Figure 11B:
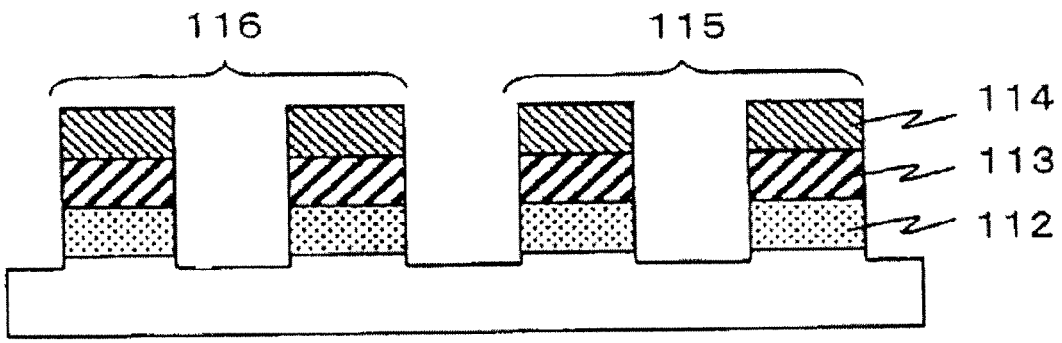
Figure 11C:
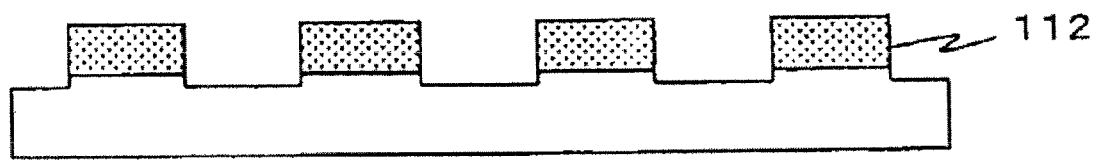
Figure 11D:
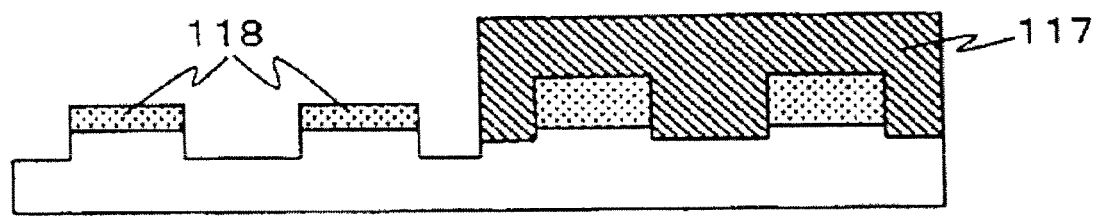
Figure 11E:
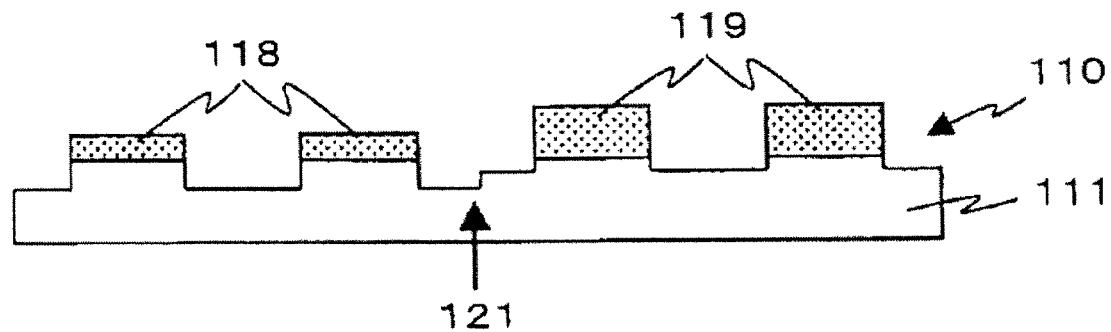

FIGS. 11A to 11E are a process cross-sectional schematic view in the case of producing a photomask of the present invention by using a publicly known conventional manufacturing method. As shown in FIGS. 11A to 11E, a semi-transparent film 112 is formed on a transparent substrate 111 to obtain film thickness for allowing a retardation of 180° between the light transmitting through the semi-transparent film and the light transmitting through a transparent region of the transparent substrate, and subsequently form a light shielding film 113 on the semi-transparent film (FIG. 11A). Next, a first resist pattern 114 is formed on the light shielding film 113, and the light shielding film 113 and the semi-transparent film 112 are sequentially dry-etched to form a main pattern part 115 and an assist pattern part 116 (FIG. 11B). Next, the first resist pattern 114 is peeled off to remove the exposed light shielding film of the pattern parts by etching (FIG. 11C). Subsequently, the main pattern part 115 is covered with a second resist pattern 117 to form an assist pattern 118 by dry-etching the semi-transparent film of the assist pattern part until film thickness for allowing a predetermined retardation between the light transmitting through the assist pattern part and the light transmitting through the transparent region of the transparent substrate is obtained (FIG. 11D), and obtain a halftone mask 110 by peeling off the second resist pattern 117 (FIG. 11E).

However, in the above-mentioned manufacturing method, the transparent substrate 111 surface not covered with the second resist pattern 117 is simultaneously etched during dry-etching of the semi-transparent film of the assist pattern part 116; as shown in (FIG. 11E), a level difference 121 is caused on the transparent substrate 111 surface on a boundary surface of the resist pattern 117 to cause a problem such that the mask quality is deteriorated and not put to practical use. Accordingly, the conventional mask manufacturing method as described above may not be applied to the production of a photomask of the present invention.

Manufacturing Method of Photomask of the Present Invention

First Embodiment

Thus, a manufacturing method of a photomask of the present invention is a manufacturing method for solving the above-mentioned problems, and a manufacturing method of a photomask which uses an ArF excimer laser as an exposing source, is used for a projection exposure by an off axis illumination, and is provided on a transparent substrate with a main pattern to be transferred to a transfer-target surface by a projection exposure and an assist pattern to be formed nearby the main pattern and not transferred to a transfer-target surface.

Figure 7A:
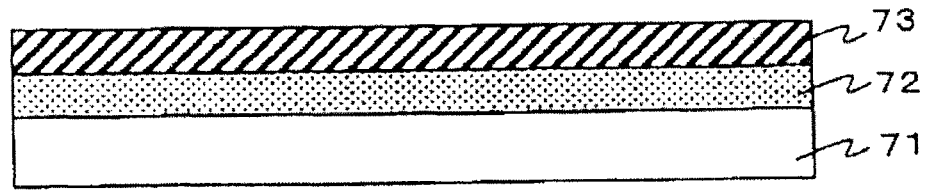
FIGS. 7A to 7E are a process cross-sectional schematic view showing a first embodiment of a manufacturing method of a photomask of the present invention.

FIGS. 7A to 7E is a process cross-sectional schematic view showing a first embodiment of a manufacturing method of a photomask of the present invention shown in FIG. 1. As shown in FIG. 7A, a semi-transparent film 72 is formed on a transparent substrate 71 such as a synthetic quartz substrate to obtain film thickness for allowing a retardation of approximately 180° between the light transmitting through the semi-transparent film 72 and the light transmitting through a transparent region of the transparent substrate 71, and subsequently prepare photomask blanks such that a light shielding film 73 is formed on the above-mentioned semi-transparent film 72.

A conventionally known method may be applied to the formation of the semi-transparent film 72 and the light shielding film 73; for example, a molybdenum silicide oxide film (MoSiO) as the semi-transparent film 72 may be formed by a reactive sputtering method in a mixed gas atmosphere of argon and oxygen with the use of a mixed target (Mo:Si=1: 2% by mol) of molybdenum and silicon. Also, in the case where the light shielding film 73 is a metal film such as chromium, a predetermined film thickness may be formed by a sputtering method.

The reason why the film thickness of the above-mentioned semi-transparent film 72 is determined at film thickness for allowing a light retardation of approximately 180° is as follows. In the case where the semi-transparent film 72 is dry-etched to form a mask pattern, ordinarily the transparent substrate 71 surface is also etched slightly. The etching depth is preferably 4 nm and the upper limit thereof is determined at 10 nm in the present invention. The etching depth of more than 10 nm brings no good influence on mask properties. Thus, in a halftone mask of the present invention, the etching depth of the transparent substrate 71 surface during dry-etching of the semi-transparent film 72 is controlled to a predetermined depth within the scope of 0 to 10 nm to determine retardation while previously including this depth. Accordingly, the thickness of the semi-transparent film in forming is determined at film thickness for allowing a retardation of approximately 180° in previous consideration of fluctuation due to etching of the transparent substrate to finally allow a retardation of 180° after forming the main pattern. The following embodiments are described while determining the above-mentioned predetermined etching depth at 4 nm as an example. In the present invention, an atomic force microscope (AFM) was used for measuring film thickness and a phase shift amount measuring apparatus (MPM193™: manufactured by Lasertec Corporation) was used for measuring retardation.

Figure 7B:
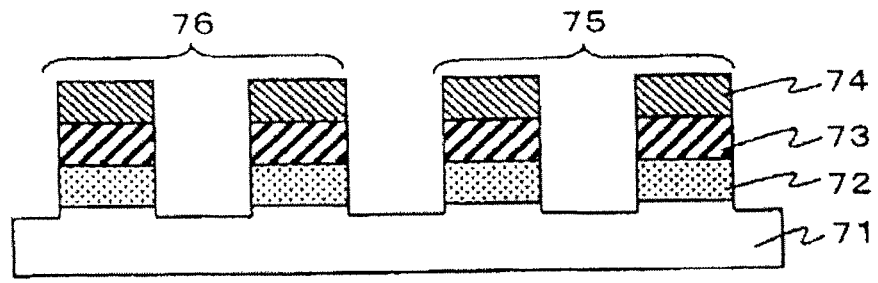

Next, a first resist pattern 74 is formed on the above-mentioned light shielding film 73, and the light shielding film 73 and the semi-transparent film 72 are sequentially dry-etched into a pattern to form a main pattern part 75 and an assist pattern part 76 (FIG. 7B).

Figure 7C:
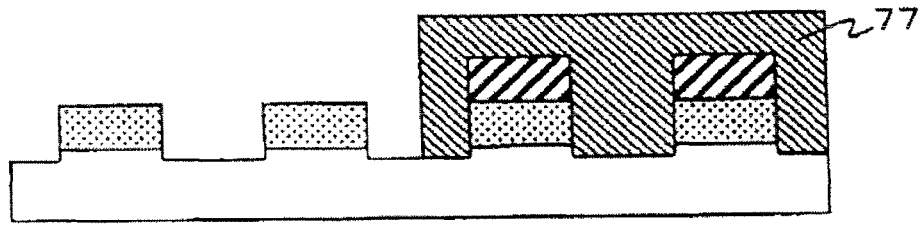

Next, the above-mentioned first resist pattern 74 is peeled off, and a second resist pattern 77 is formed on the light shielding film to remove the light shielding film 73 in the assist pattern part 76 by etching (FIG. 7C).

In the case where the semi-transparent film 72 is a semi-transparent film made of molybdenum silicide-based materials, a pattern may be formed by dry-etching with the use of fluorine-based gas such as $CF_4$, $CHF_3$ and $C_2F_6$, or mixed gas thereof, or alternatively a gas, with which oxygen is mixed, as etching gas. In the case where the light shielding film 73 is made of chromium, a pattern may be formed by dry-etching with the use of mixed gas of $Cl_2$ and oxygen as etching gas without damaging the semi-transparent film 72 and the transparent substrate 71. In the above-mentioned process of FIG. 7C, the light shielding film 73 may be also removed by not dry-etching but wet-etching in an aqueous solution of a ceric ammonium nitrate salt.

Figure 7D:
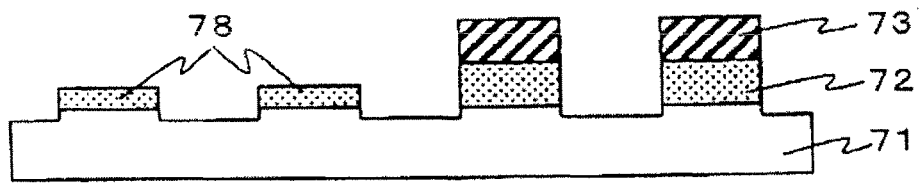

Subsequently, the second resist pattern 77 is peeled off, and the whole principal plane of the transparent substrate 71 is dry-etched on the etching conditions of the semi-transparent film 72 to form an assist pattern 78 by dry-etching the semi-transparent film of the assist pattern part until film thickness for allowing a predetermined retardation within the scope of 70° to 115° between the light transmitting through the assist pattern and the light transmitting through a transparent region of the transparent substrate 71 is obtained (FIG. 7D). The etching amount of the assist pattern 78 for allowing the above-mentioned retardation corresponds to a predetermined film thickness difference within the scope of 24 nm to 40 nm in film thickness difference from the semi-transparent film of the main pattern part. The main pattern part is not etched by reason of being covered with the light shielding film 73, and film thickness in forming the semi-transparent film is retained. In the process of FIG. 7D, the dry-etching allows the whole mask to be etched uniformly with high precision and allows retardation of the assist pattern 78 to be controlled to a predetermined value with high precision.

Figure 7E:
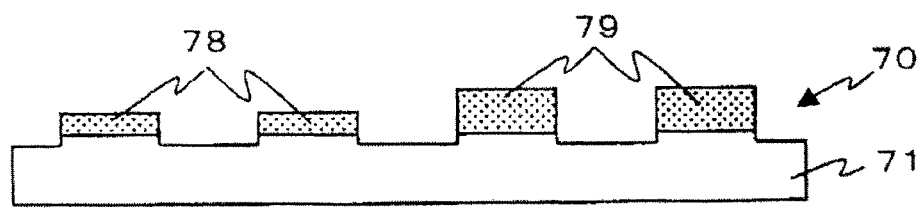

Next, the light shielding film of the main pattern part is removed by etching to form a main pattern 79 and then a halftone mask 70 having the assist pattern for generating a retardation of 180° between the light transmitting through the main pattern 79 and the light transmitting through a transparent region of the transparent substrate 71 (FIG. 7E). In the process of FIG. 7E, the light shielding film 73 may be removed by either method of dry-etching or wet-etching.

The manufacturing method of a photomask according to the above-mentioned first embodiment allows the high-quality halftone mask 70 having the assist pattern 78 without causing the level difference as described in FIGS. 11A to 11E on the transparent substrate 71 surface.

For example, in the case where molybdenum silicide with a film thickness of 68 nm is used as the semi-transparent film, a high-quality halftone mask such that the main pattern (a film thickness of 68 nm) has ArF excimer laser light transmittance of 6% and a retardation of 180° with a transparent region of the transparent substrate, and the assist pattern has a predetermined film thickness difference within the scope of 24 nm to 40 nm with the main pattern and a predetermined retardation within the scope of 70° to 115° with a transparent region of the transparent substrate may be easily produced.

Second Embodiment

Figure 8A:
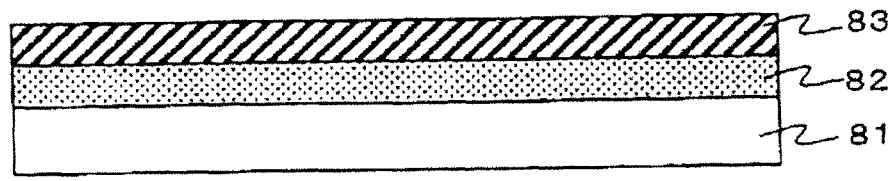
FIGS. 8A to 8E are a process cross-sectional schematic view showing a second embodiment of a manufacturing method of a photomask of the present invention.

FIGS. 8A to 8E are a process cross-sectional schematic view showing a second embodiment of a manufacturing method of a photomask of the present invention shown in FIG. 1; similarly to FIG. 7A, a semi-transparent film 82 is formed on a transparent substrate 81 to obtain film thickness for allowing a retardation of approximately 180° between the light transmitting through the semi-transparent film 82 and the light transmitting through a transparent region of the transparent substrate 81, and subsequently prepare photomask blanks such that a light shielding film 83 is formed on the above-mentioned semi-transparent film (FIG. 8A).

Figure 8B:
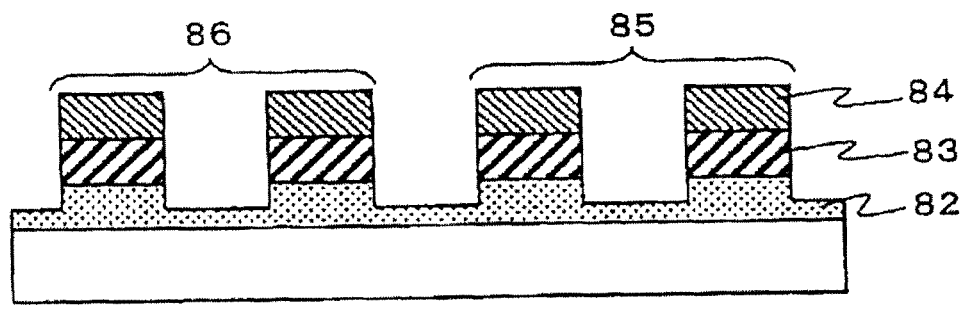

Next, a first resist pattern 84 is formed on the light shielding film 83, and the light shielding film 83 and the semi-transparent film 82 are sequentially dry-etched to stop etching in the halfway stage of half-etching the semi-transparent film 82. In this stage, a thin layer of the semi-transparent film 82 to be removed remains partially on the transparent substrate 81 in a state of being half-etched, and yet a main pattern part 85 and an assist pattern part 86 are formed in a state of having the half-etching part (FIG. 8B). The film thickness of the half-etching part of the half-etched semi-transparent film 82 in this stage is previously determined so as to become film thickness to be simultaneously removed by etching during etching of the assist pattern in the later process.

Figure 8C:
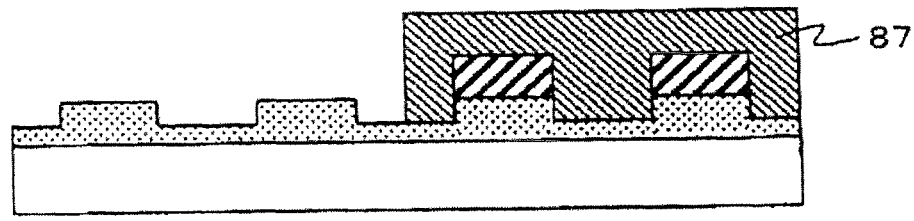

Next, the above-mentioned first resist pattern 84 is peeled off, and a second resist pattern 87 is formed on the light shielding film to remove the light shielding film in the assist pattern part by etching (FIG. 8C). In the process of FIG. 8C, the light shielding film 83 may be removed by either method of dry-etching or wet-etching.

Figure 8D:
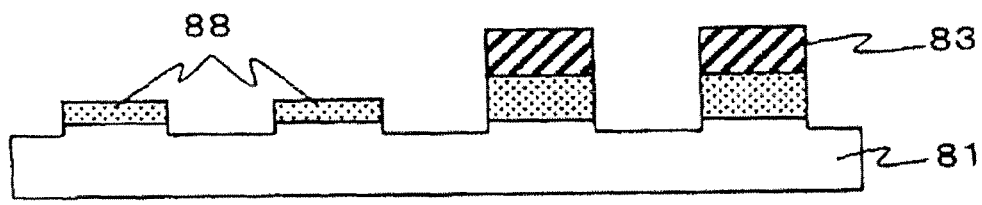

Subsequently, the second resist pattern 87 is peeled off, and the whole principal plane of the transparent substrate 81 is dry-etched on the etching conditions of the semi-transparent film 82 to form an assist pattern 88 by dry-etching the semi-transparent film of the assist pattern part until film thickness for allowing a predetermined retardation within the scope of 70° to 115° between the light transmitting through the assist pattern and the light transmitting through a transparent region of the transparent substrate 81 is obtained (FIG. 8D). The etching amount of the assist pattern 88 for allowing the above-mentioned retardation corresponds to a predetermined film thickness difference within the scope of 24 nm to 40 nm in film thickness difference from the main pattern. At this time, the half-etching part of the semi-transparent film 82 remaining in a state of being half-etched is etched simultaneously. The main pattern part is not etched by reason of being covered with the light shielding film 83.

Figure 8E:
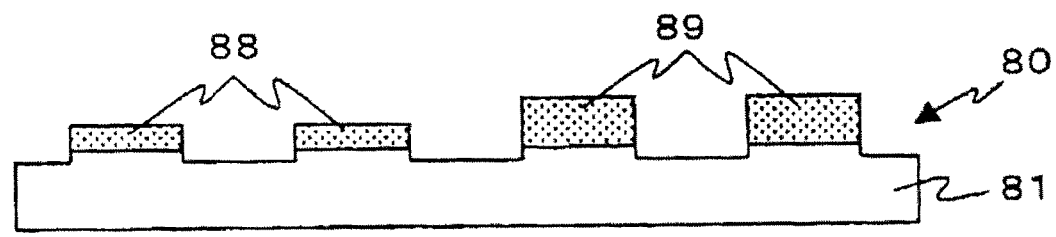

Next, the light shielding film of the main pattern part is removed by etching to form a main pattern 89 and then a halftone mask 80 having the assist pattern 88 for generating a retardation of 180° between the light transmitting through the main pattern 89 and the light transmitting through a transparent region of the transparent substrate 81 (FIG. 8E). In the process of FIG. 8E, the light shielding film 83 may be removed by either method of dry-etching or wet-etching.

The manufacturing method of a photomask according to the above-mentioned second embodiment allows the high-quality halftone mask 80 having the assist pattern 88 without causing the level difference as described in FIGS. 11A to 11E on the transparent substrate 81 surface.

Third Embodiment

Figure 9A:
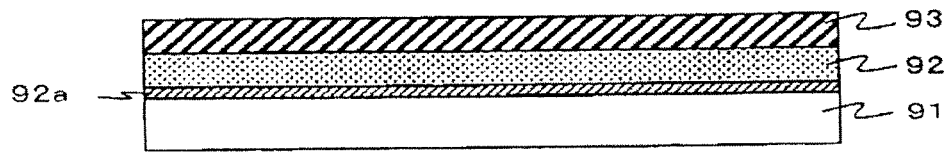
FIGS. 9A to 9F are a process cross-sectional schematic view showing a third embodiment of a manufacturing method of a photomask of the present invention.

FIGS. 9A to 9F are a process cross-sectional schematic view showing an embodiment of a manufacturing method of a photomask of the present invention shown in FIG. 2. As shown in FIG. 9A, a semi-transparent film 92a and a semi-transparent film 92 are sequentially formed on a transparent substrate 91 such as a synthetic quartz substrate to form a two-layer semi-transparent film. The lower-layer semi-transparent film 92a has the function of an etch stop layer during dry-etching of the upper-layer semi-transparent film 92 and also has the function as a mask material for a semi-transparent film. The film thickness for allowing a retardation of approximately 180° between the light transmitting through the two-layer semi-transparent film and the light transmitting through a transparent region of the transparent substrate 91 is obtained to subsequently prepare photomask blanks such that a light shielding film 93 is formed on the above-mentioned two-layer semi-transparent film.

A conventionally known method may be applied to the formation of the semi-transparent film 92a, the semi-transparent film 92 and the light shielding film 93. For example, a chromium oxide film (CrO), a chromium nitride film (CrN) and a chromium oxide nitride film (CrON), which are chromium-based materials, are used as the lower-layer semi-transparent film 92a. The reason therefor is that a thin film made of the above-mentioned chromium-based materials is semi-transparent against exposing light and resistant to fluorine-based gas used for dry-etching molybdenum silicide-based materials. The chromium-based materials may be formed by a conventionally known reactive sputtering method. Examples of the upper-layer semi-transparent film 92 include the above-mentioned molybdenum silicide-based materials. The semi-transparent film 92 of a molybdenum silicide oxide film (MoSiO) may be formed by a reactive sputtering method in a mixed gas atmosphere of argon and oxygen with the use of a mixed target (Mo:Si=1:2% by mol) of molybdenum and silicon. Chromium is used for the light shielding film 93 and a predetermined film thickness may be formed by a sputtering method.

Figure 9B:
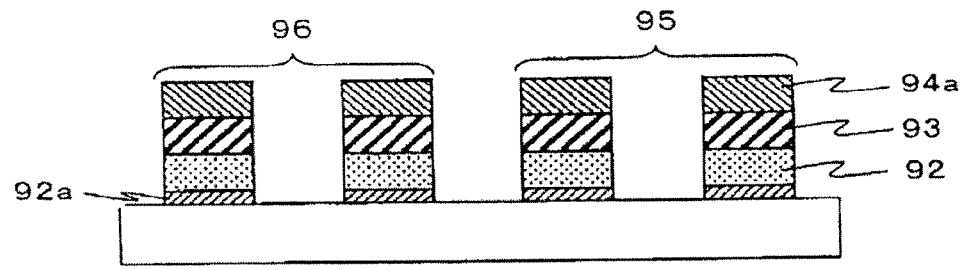

Next, a first resist pattern 94a is formed on the above-mentioned light shielding film 93, and the light shielding film 93, the semi-transparent film 92 and the semi-transparent film 92a are sequentially dry-etched into a pattern to form a main pattern part 95 and an assist pattern part 96 (FIG. 9B). The transparent substrate 91 is not damaged during etching of the semi-transparent film 92a.

In the process of FIG. 9B, in the case where the light shielding film 93 is made of chromium, a pattern may be formed by dry-etching with the use of mixed gas of $Cl_2$ and oxygen as etching gas without damaging the semi-transparent film and the transparent substrate. In the case where the semi-transparent film 92 is a semi-transparent film made of molybdenum silicide-based materials, a pattern may be formed by dry-etching with the use of fluorine-based gas such as $CF_4$, $CHF_3$ and $C_2F_6$, or mixed gas thereof, or alternatively a gas, with which oxygen is mixed, as etching gas. In the case where the semi-transparent film 92a is made of a chromium-based material such as a chromium oxide nitride film, dry-etching may be performed with the use of mixed gas of $Cl_2$ and oxygen as etching gas.

Figure 9C:
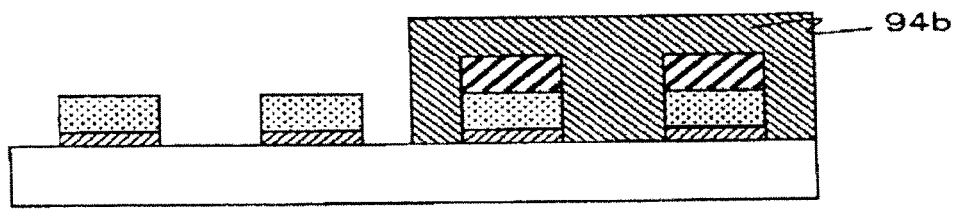

Next, the above-mentioned first resist pattern 94a is peeled off, and a second resist pattern 94b is formed on the light shielding film to remove the light shielding film 93 in the assist pattern part 96 by etching (FIG. 9C). Etching of the light shielding film 93 may be dry-etching and the light shielding film 93 may be also removed by wet-etching in an aqueous solution of a ceric ammonium nitrate salt.

Figure 9D:
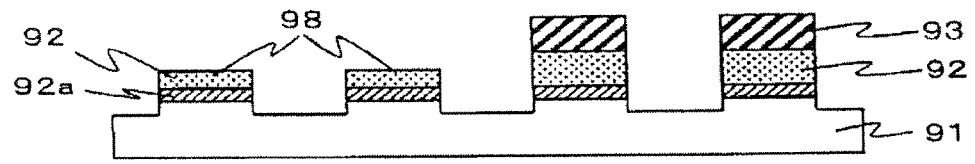

Subsequently, the second resist pattern 94b is peeled off, and the whole principal plane of the transparent substrate 91 is dry-etched on the etching conditions of the semi-transparent film 92 to form an assist pattern 98 by dry-etching the semi-transparent film of the assist pattern part until film thickness for allowing a predetermined retardation within the scope of 70° to 115° between the light transmitting through the assist pattern and the light transmitting through a transparent region of the transparent substrate 91 is obtained (FIG. 9D). The etching amount of the assist pattern 98 for allowing the above-mentioned retardation corresponds to a predetermined film thickness difference within the scope of 24 nm to 40 nm in film thickness difference from the main pattern. The main pattern part is not etched by reason of being covered with the light shielding film 93.

Figure 9E:
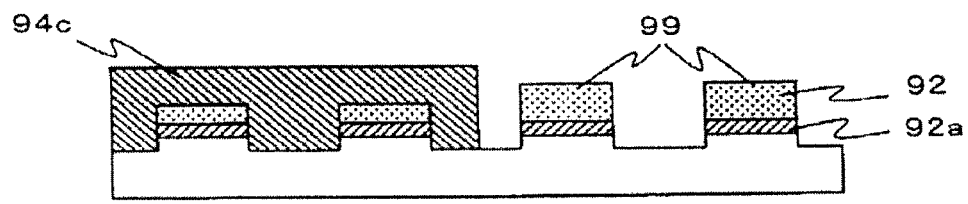
Figure 9F:
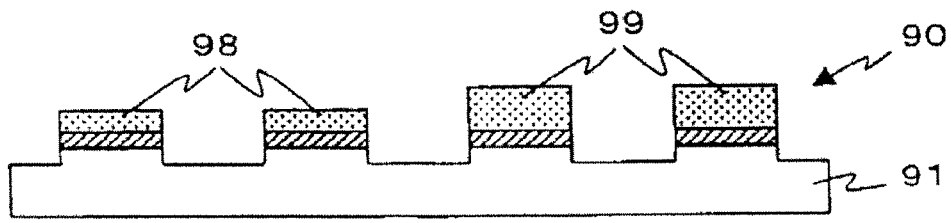

Next, the light shielding film 93 of the main pattern part is removed by etching to form a main pattern 99 and then a halftone mask 90 having the assist pattern 98 for generating a retardation of 180° between the light transmitting through the main pattern 99 and the light transmitting through a transparent region of the transparent substrate 91 (FIG. 9E). In the process of FIG. 9E, the light shielding film 93 may be removed by either method of dry-etching or wet-etching.

The manufacturing method of a photomask according to the above-mentioned third embodiment allows the high-quality halftone mask 90, such that the digging depth of the transparent substrate is prevented from varying in a mask plane and between patterns, without causing the level difference as described in FIGS. 11A to 11E on the transparent substrate 91 surface.

Fourth Embodiment

FIGS. 10A to 10D are a process cross-sectional schematic view showing a fourth embodiment of a manufacturing method of a photomask of the present invention. The fourth embodiment is a manufacturing method of a photomask in the case of leaving a light shielding film in a necessary predetermined spot in the above-mentioned first to third embodiments.

Ordinarily, the mask outer periphery is subject to multiple exposure in a projection exposure, so that a photomask provided with a light shielding region in the mask outer periphery is used. The fourth embodiment is an example such that a light shielding region is provided in the photomask outer periphery, and is described by FIGS. 10A to 10D while hereinafter referring to FIGS. 7A to 7E for the reason that the processes from the beginning to the halfway are the same as the processes described in the first to third embodiments. In FIGS. 10A to 10D, the same reference numerals are used in the same spots as FIGS. 7A to 7E.

Figure 10A:
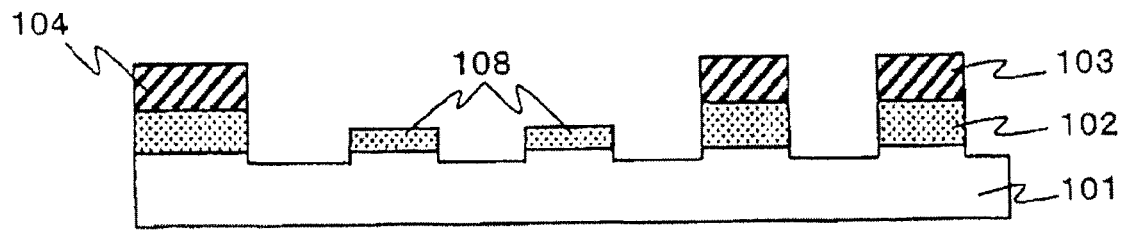
FIGS. 10A to 10D are a process cross-sectional schematic view showing a fourth embodiment of a manufacturing method of a photomask of the present invention.

As shown in FIG. 10A, an assist pattern part 108 is formed by performing the production processes until the process shown in FIG. 7D. At this time, a light shielding film in a predetermined spot necessary as a photomask is previously left. FIGS. 10A to 10D exemplify the case of leaving a light shielding film 104 as a light shielding region in the photomask outer periphery.

Figure 10B:
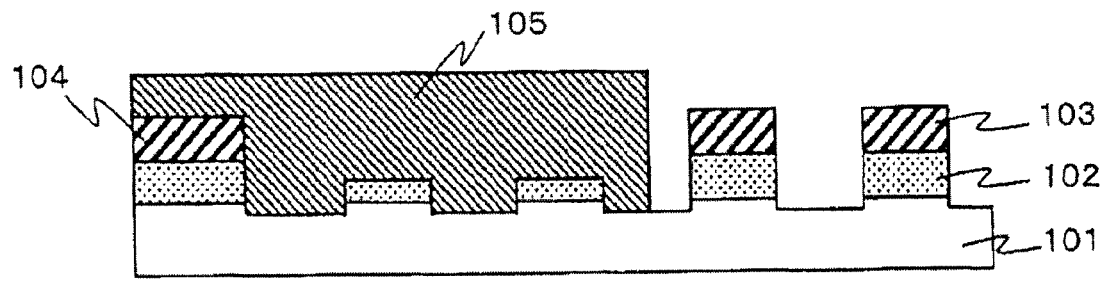
Figure 10C:
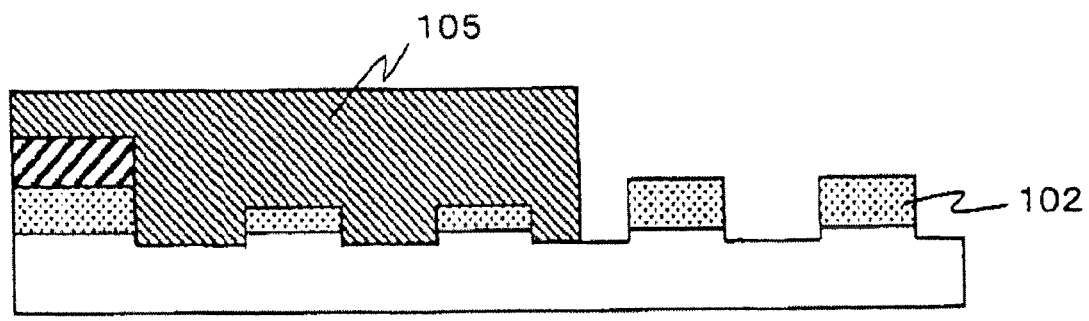
Figure 10D:
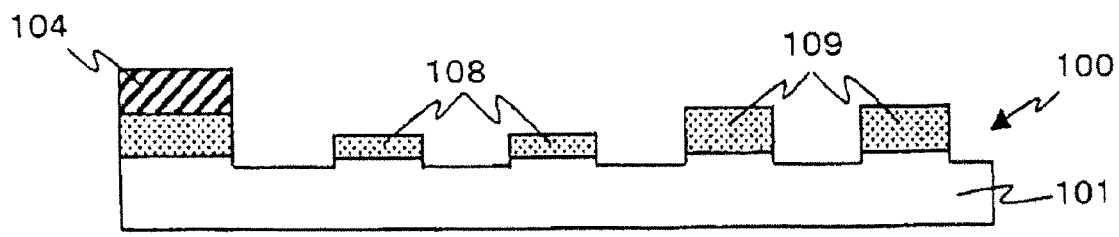

Next, as shown in FIG. 10B, a resist pattern 105 for a light shielding region is formed on the light shielding film 104 in a necessary predetermined spot. The resist pattern 105 for a light shielding region may be formed not merely on the light shielding film 104 but also so as to cover the assist pattern 108. Next, a light shielding film 103 on a main pattern is removed by etching (FIG. 10C), and subsequently the resist pattern 105 for a light shielding region is peeled off to form a main pattern 109 and then a halftone mask 100 having the assist pattern 108, such that the light shielding film 104 as a light shielding region is provided in the photomask outer periphery (FIG. 10D).

The manufacturing method of a photomask according to the above-mentioned fourth embodiment allows the high-quality halftone mask having the assist pattern, such that the light shielding region is provided in the mask outer periphery, without causing the level difference as described in FIGS. 11A to 11E on the transparent substrate 101 surface.

Also in the second and third embodiments as a manufacturing method of a photomask of the present invention, a light shielding region may be provided similarly in a desired region such as the mask outer periphery.

(SRAF Etching Amount and SRAF Dimension on Wafer)

Next, with regard to a manufacturing method of the present invention, an embodiment in changing a pitch in a line/space pattern is described in detail.

Figure 12:
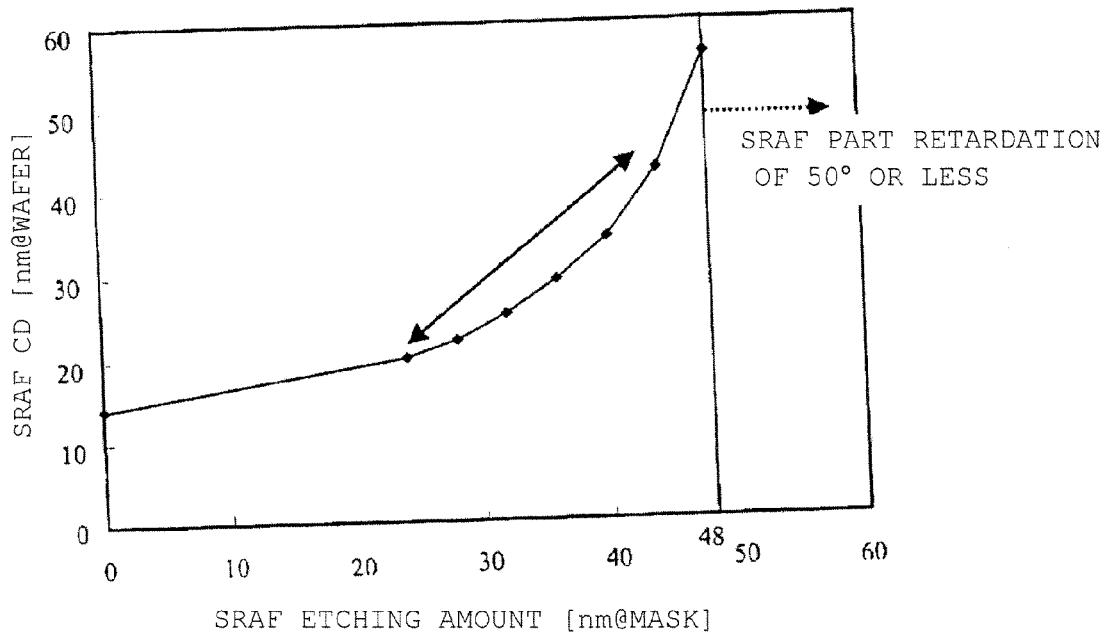
FIG. 12 is a view showing a relation between SRAF etching amount (on a mask) and SRAF CD (a dimension on a wafer) in the embodiment shown in FIG. 3.

As described above, in order that SRAF may not be transferred on a wafer, SRAF light intensity/slice level needs to be 1 or more. FIG. 12 is a view showing a relation between SRAF etching amount (on a mask) and SRAF CD (a dimension on a wafer), which satisfies SRAF light intensity/slice level=1.1 with a margin of 10% in the embodiment of a Cquad illumination shown in FIGS. 3A and 3B. The SRAF etching amount corresponds to retardation in an SRAF part and larger SRAF etching amount brings larger SRAF dimension transferred on a wafer. The SRAF etching amount signifies film thickness difference between SRAF film thickness after etching and film thickness of a main pattern (the initial film thickness of a semi-transparent film: 68 nm).

In FIG. 12, a region with an SRAF etching amount of 48 nm or more shown by a dotted arrow in the FIG. corresponds to a region with an SRAF part retardation of 50° or less (the scope described in the invention of the above-mentioned Patent Literature 2). In this case, SRAF CD on a wafer becomes 50 nm or more. However, when SRAF dimension on a wafer is 50 nm (200 nm on a quadruple mask) or more, a space between the main pattern and SRAF becomes as narrow as 200 nm or less on a mask, which is a strict value for scarcely allowing misalignment in mask production processes. In the present laser exposure device for mask production, ordinarily, 200 nm or more is so necessary as a space between patterns in consideration of misalignment that too large SRAF dimension makes mask production difficult. On the other hand, when an SRAF etching amount is less than 24 nm (SRAF CD on a wafer is 20 nm), SRAF dimension may not sufficiently be enlarged. Accordingly, in FIG. 12, a region shown by a solid double-pointed arrow is a preferable SRAF etching amount region in consideration of mask production.

(Influence of SRAF Etching Amount Error on Main Pattern CD)

Figure 13:
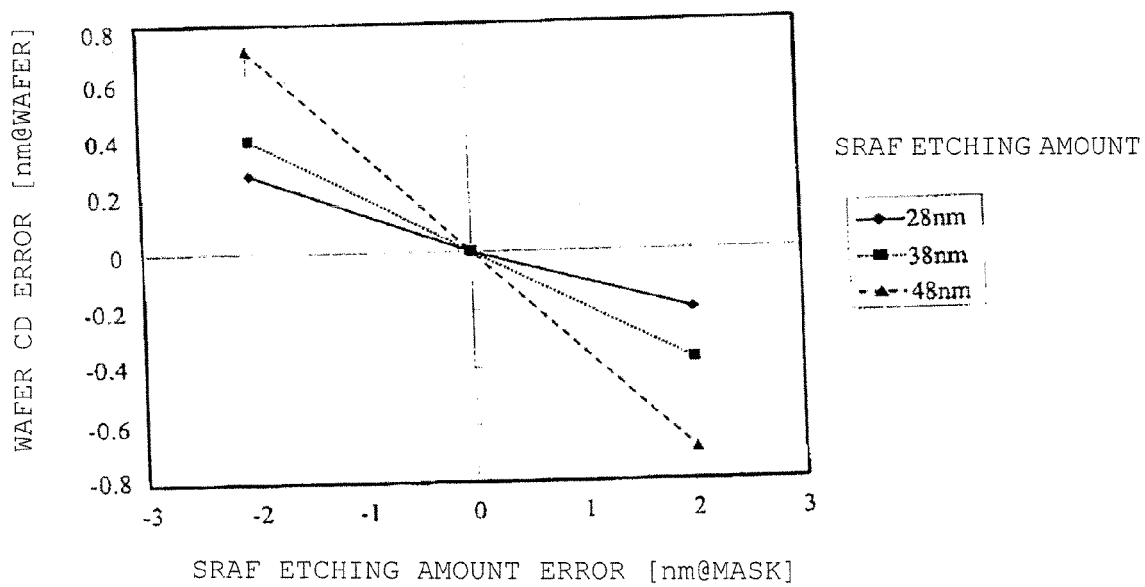
FIG. 13 is a view showing an influence of SRAF etching amount error on main pattern CD in the embodiment shown in FIGS. 3A and 3B.

Next, in the case where an error occurs in an SRAF etching amount, an influence on main pattern CD adjacent to SRAF is described by FIG. 13. FIG. 13 shows main pattern CD error on a wafer with respect to etching amount error when an SRAF etching amount is 28 nm, 38 nm and 48 nm in the embodiment of a Cquad illumination shown in FIGS. 3A and 3B, and it is found that larger SRAF etching amount brings larger main pattern CD fluctuation on a wafer. When an SRAF etching amount is 48 nm, it is shown that a slight etching error has a great influence on main pattern dimension at a repetition end. Accordingly, in the present invention, an SRAF etching amount of 48 nm or more (corresponding to a retardation of 50° or less in Patent Literature 2) is an unpreferable scope in production processes.

(Influence on SRAF Etching Amount and Main Pattern at Repetition End)

When an SRAF etching amount is changed, the influence on main pattern CD at a repetition end and Defocus, and light intensity distribution are described.

Figure 14:
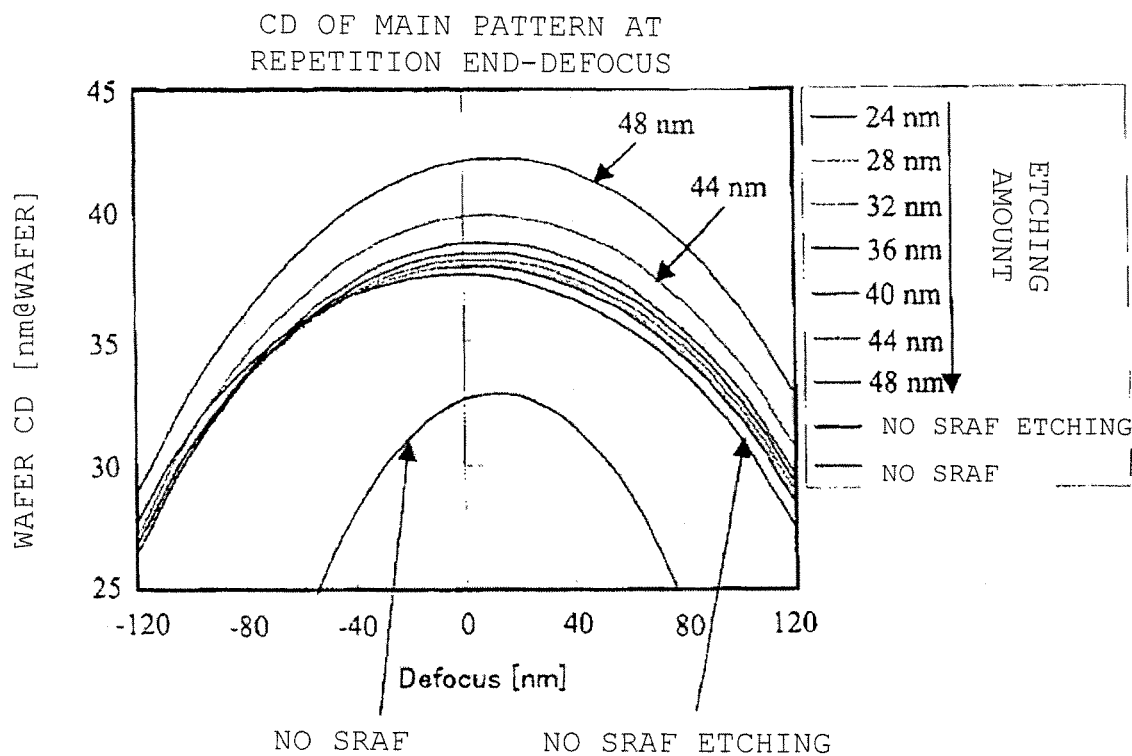
FIG. 14 is a view showing a relation between main pattern CD at a repetition end on a wafer and Defocus in changing SRAF etching amount in the embodiment shown in FIGS. 3A and 3B.

FIG. 14 is a view showing a relation between main pattern CD at a repetition end on a wafer and Defocus in changing an SRAF etching amount at every 4 nm within the scope of 24 nm to 48 nm in the embodiment of a Cquad illumination shown in FIGS. 3A and 3B. For reference, the case of no SRAF itself and the case of no SRAF etching are also shown in the drawings. When an SRAF etching amount is within the scope of 24 nm to 40 nm, the fluctuation of main pattern CD is comparatively gentle to the change of Defocus and shows approximately the same behavior. However, when an SRAF etching amount is 44 nm and 48 nm, main pattern CD shows a great fluctuation with respect to the change of Defocus.

Figure 15:
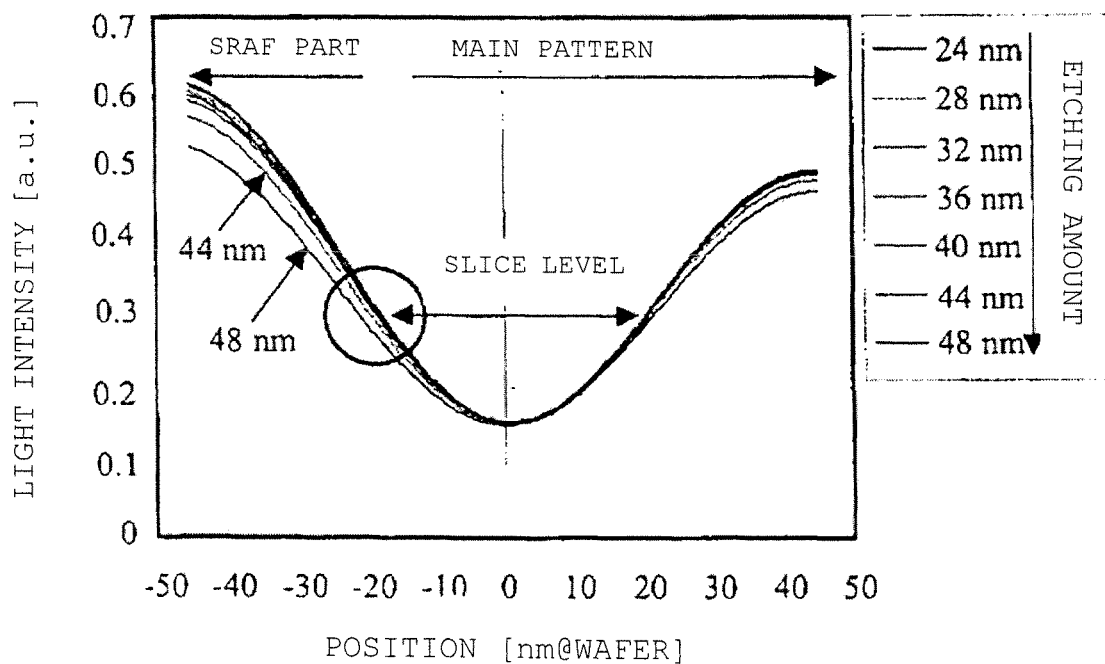
FIG. 15 is a view showing light intensity distribution of a main pattern at a repetition end on a wafer in changing SRAF etching amount in the embodiment shown in FIGS. 3A and 3B.

FIG. 15 shows light intensity distribution of a main pattern at a repetition end on a wafer in changing an SRAF etching amount at every 4 nm within the scope of 24 nm to 48 nm in the embodiment of a Cquad illumination shown in FIGS. 3A and 3B. When an SRAF etching amount is within the scope of 24 nm to 40 nm, the inclination of light intensity distribution is comparatively large and shows approximately the same behavior. However, when an SRAF etching amount is 44 nm and 48 nm, the inclination of light intensity distribution becomes so small as to show that resolution of the main pattern decreases.

Accordingly, through the results shown in FIGS. 12 to 15, an SRAF etching amount of 44 nm or more is an inappropriate scope, and an SRAF etching amount of 24 nm to 40 nm is a preferable scope for improving focal depth and forming a high-resolution pattern. This etching amount corresponds to a retardation of 115° to 70°, respectively. The measurement of retardation was performed by the above-mentioned phase shift amount measuring apparatus (MPM193™: manufactured by Lasertec Corporation).

(Verification in SRAF Between Main Patterns)

Next, the present invention is verified with regard to the case where an assist pattern (SRAF) exists between main patterns as another embodiment.

Figure 16A:
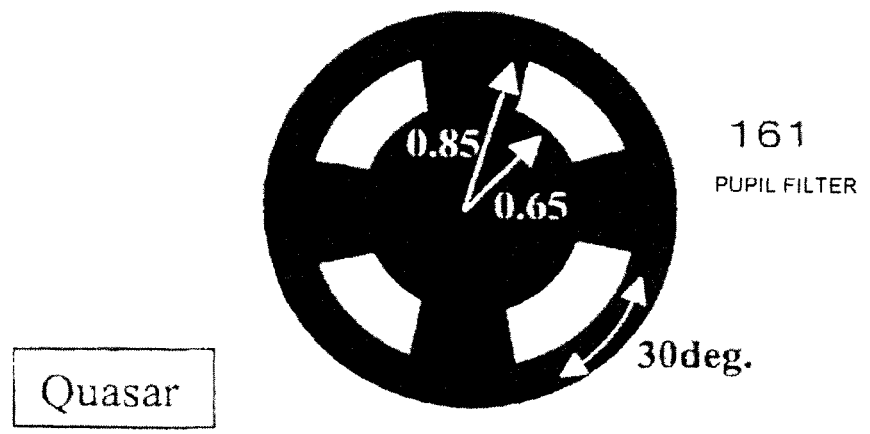
FIG. 16A is a plan schematic view of a Quasar pupil filter used for simulation.
Figure 16B:
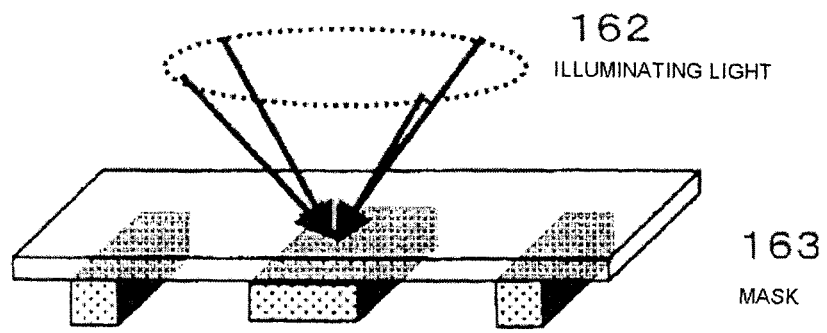
FIG. 16B is a perspective schematic view in irradiating a mask with exposing light by using Quasar.
Figure 16C:
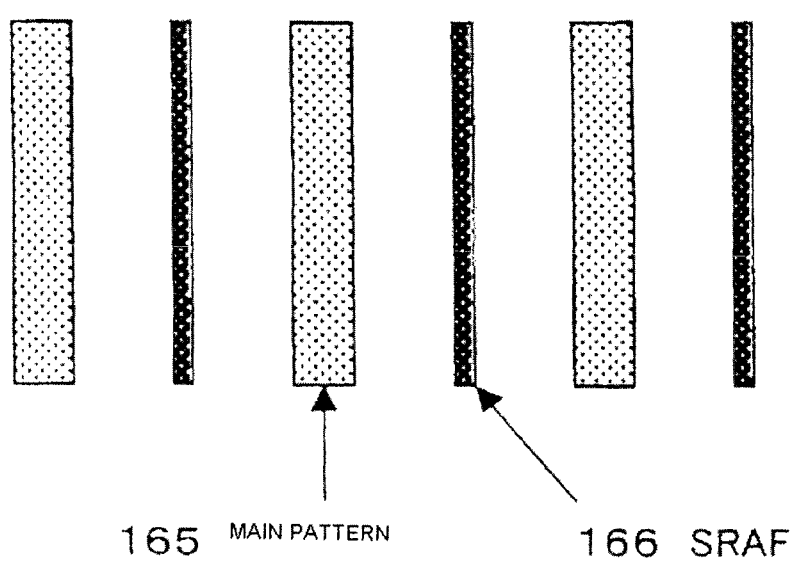
FIG. 16C is a plan schematic view of a mask pattern 164.

The same EM-Suite (trade name, manufactured by Panoramic Technology Inc.) as the above was used as simulation software. The main simulation conditions were such that an ArF excimer laser (193 nm) was used as an illuminating source, NA was 1.35, and a Quasar (registered trademark) pupil filter 161 shown in FIGS. 16A to 16C was used. FIG. 16A is a plan schematic view of the Quasar 161, FIG. 16B is a perspective schematic view in irradiating a mask 163 with exposing light by using the Quasar 161 (referred to as a Quasar illumination), and FIG. 16C is a plan schematic view of a mask pattern 164. The Quasar was such that an angular aperture of a fan-shaped light transmission part was 30°, an outside diameter was 0.85, and an inside diameter was 0.65 (a radius of the pupil filter is regarded as 1). A molybdenum silicide-based halftone mask with a transmittance of 6% in an exposure wavelength of 193 nm having an assist pattern of the present invention (6%-halftone) was used as the mask. A target CD on a wafer was 60 nm, an SRAF 166 existed in each space between main patterns 165, a pattern pitch was a through pitch line/space from the minimum pitch of 120 nm, and the SRAF 166 was of a pitch of 250 nm.

Figure 17:
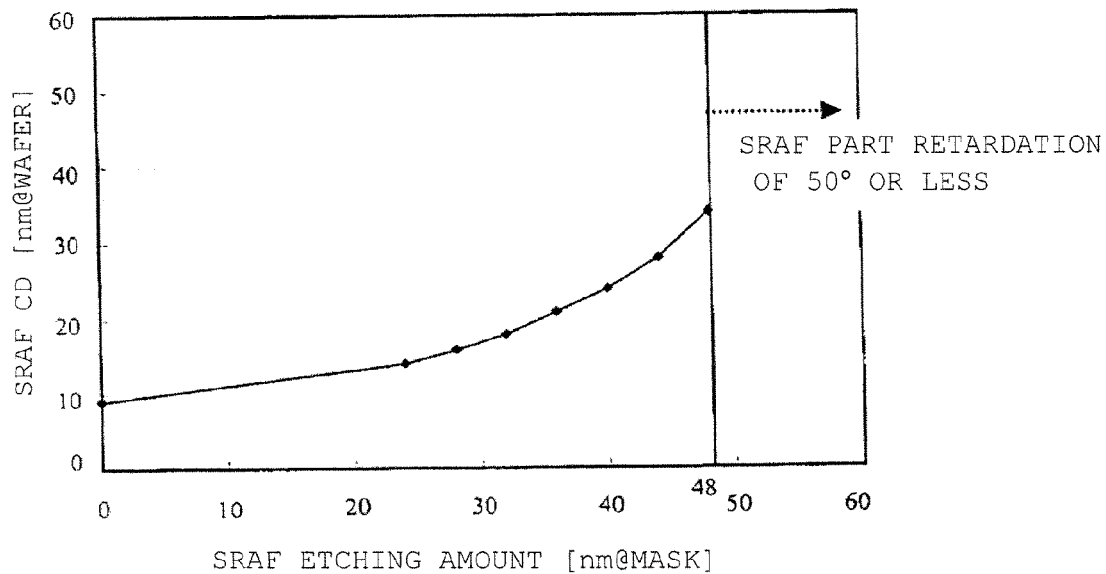
FIG. 17 is a view showing a relation between SRAF etching amount (on a mask) and SRAF CD (a dimension on a wafer) in the embodiment shown in FIGS. 16A to 16C.

FIG. 17 is a view showing a relation between SRAF etching amount (on a mask) and SRAF CD (a dimension on a wafer) in the embodiment of a Quasar illumination shown in FIGS. 16A to 16C. In FIG. 17, similarly to FIG. 12, a region with an SRAF etching amount of 48 nm or more shown by a dotted arrow in the drawing corresponds to a region with an SRAF retardation of 50° or less (the scope described in the invention of the above-mentioned Patent Literature 2). In the case of the present embodiment, as compared with the conditions of a main pattern at a line/space repetition end and Cquad shown in FIG. 12, an original SRAF dimension is so small as 9 nm on a wafer (36 nm on a mask) that the problem that the SRAF dimension on a wafer is too large is not caused even in a region with an SRAF etching amount of 48 nm or more.

Figure 18:
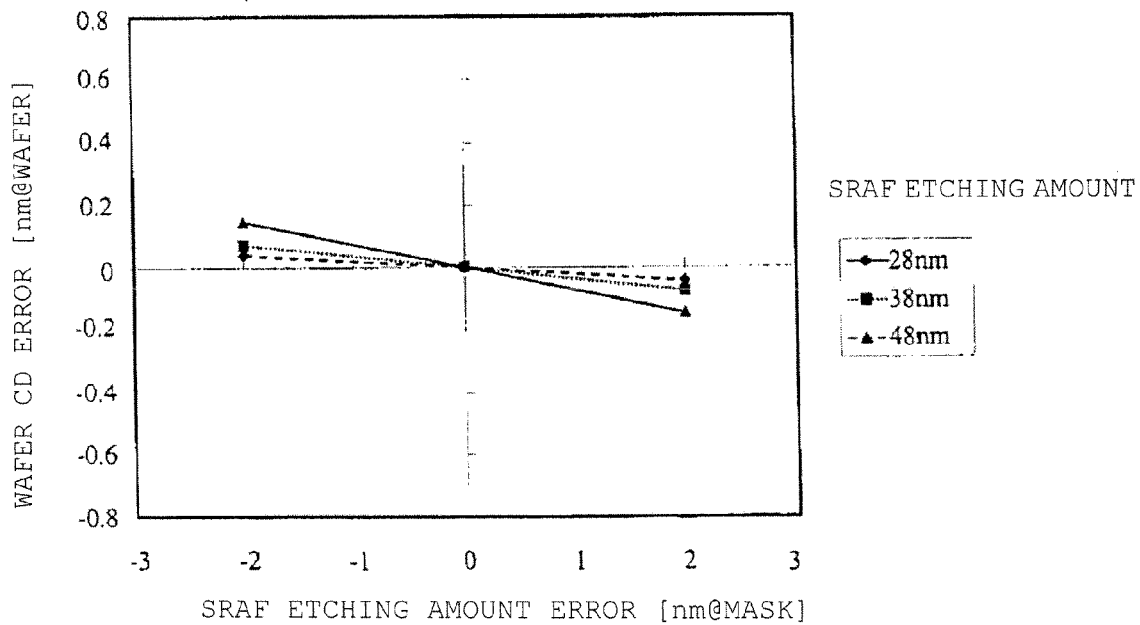
FIG. 18 is a view showing an influence of SRAF etching amount error on a mask on main pattern CD error on a wafer in the embodiment shown in FIGS. 16 A to 16C.

FIG. 18 is a view showing an influence on main pattern CD on a wafer in the case where an error occurs in an SRAF etching amount on a mask in the embodiment of a Quasar illumination shown in FIGS. 16A to 16C. Similarly to FIG. 13, the case where an SRAF etching amount is 28 nm, 38 nm and 48 nm is shown. As shown in FIG. 18, main pattern CD error on a wafer is extremely small with respect to SRAF etching amount error.

Figure 19:
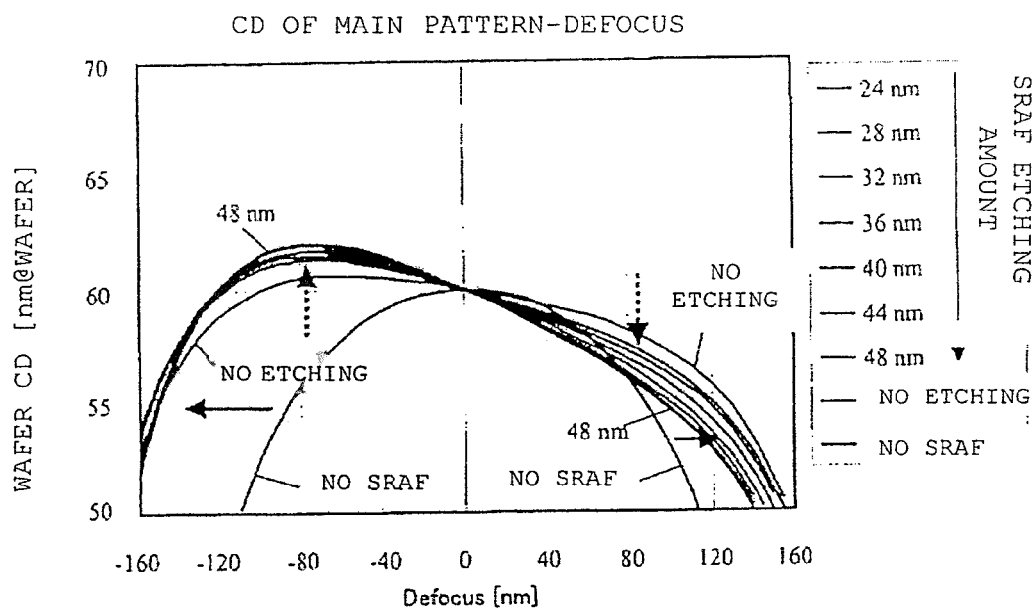
FIG. 19 is a view showing a relation between main pattern CD and Defocus in changing SRAF etching amount in the embodiment shown in FIGS. 16 A to 16C.

FIG. 19 is a view showing a relation between main pattern CD and Defocus in changing an SRAF etching amount at every 4 nm within the scope of 24 nm to 48 nm similarly to FIG. 14 in the embodiment of a Quasar illumination shown in FIGS. 16A to 16C. For reference, the case of no SRAF and the case of no SRAF etching are also shown in the drawings.

As shown in FIG. 19, focal depth is increased by providing SRAF with respect to no SRAF as shown by a solid arrow in the drawing. However, even in the case of no SRAF etching, the main pattern CD is asymmetric with respect to Defocus. As shown by a dotted arrow in the drawing, larger SRAF etching amount brings more asymmetry with respect to Defocus; the main pattern CD on a wafer rises on the minus side of Defocus and the main pattern CD on a wafer lowers on the plus side of Defocus, and fluctuation of dimension of the main pattern on a wafer becomes asymmetric. For example, when an SRAF etching amount is increased to 48 nm, transferred image properties are deteriorated due to the asymmetry property. Through the results shown in FIGS. 17 to 19, in the present invention, the upper limit of an SRAF etching amount was determined at 40 nm. Accordingly, also in the case of SRAF between the main patterns (a Quasar illumination), the effect shown by a photomask of the present invention was verified similarly to SRAF at a main pattern repetition end (a Cquad illumination).

As described above, with regard to a manufacturing method of a photomask of the present invention, a main pattern and an assist pattern are each constituted from a semi-transparent film made of the same material, so that a film-forming process of the semi-transparent film is easy. Also, retardation between the light transmitting through the assist pattern and the light transmitting through a transparent region of a transparent substrate is determined at a predetermined retardation within the scope of 70° to 115°, and the semi-transparent film of the assist pattern is dry-etched to obtain film thickness difference between a first thickness of the main pattern and a second thickness of the assist pattern as a predetermined film thickness difference within the scope of 24 nm to 40 nm, namely, an etching amount of the assist pattern, so that a desired retardation of the assist pattern may be easily obtained. In addition, a space between the main pattern and the assist pattern is widened so more as to allow a manufacturing method having a high margin of misalignment and allow a photomask for improving transfer properties of the pattern without increasing difficulty in mask production.

C. Photomask

A photomask of the present invention is a photomask comprising on a principal plane of a transparent substrate a main pattern which is transferred to a transfer-target surface by the above-mentioned projection exposure and an assist pattern which is formed nearby the above-mentioned main pattern and not transferred to the above-mentioned transfer-target surface, characterized in that the above-mentioned main pattern and the above-mentioned assist pattern are each consti- tuted from a semi-transparent film made of the same material, film thickness of the above-mentioned assist pattern is thinner than that of the above-mentioned main pattern, and film thickness difference is a predetermined film thickness difference within the scope of 24 nm to 40 nm.

According to a photomask of the present invention, the determination of film thickness difference between a first thickness of the main pattern and a second thickness of the assist pattern at a predetermined scope allows phenomena to be restrained from occurring such that part of the assist pattern is chipped, the assist pattern is peeled off from a substrate surface, and the assist pattern falls in the line width direction.

Examples of a photomask of the present invention include the same photomask as the above-mentioned photomask shown in FIGS. 1 and 2.

Also, a photomask of the present invention preferably uses a shortwave exposing source as an exposing source. Examples of such a shortwave exposing source include excimer lasers such as an ArF excimer laser and a KrF excimer laser, and an i line of a mercury-vapor lamp; among them, excimer lasers are preferable and an ArF excimer laser is particularly preferable.

In addition, a photomask of the present invention may be a photomask used for an exposure by an ordinary illumination, or a photomask used for a projection exposure by an off axis illumination. The description of members of the photomask and other technical characteristics is the same as the contents described in the above-mentioned "A. Photomask" and the above-mentioned "B. Manufacturing method of photomask"; therefore, the description herein is not repeated here.

D. Correcting Method of Photomask

A photomask intended for by a correcting method of a photomask of the present invention is a mask having an assist pattern, which uses an ArF excimer laser as an exposing source, is used for a projection exposure by an off axis illumination, and is preferably intended to be used for forming a minute semiconductor device with a half pitch of 65 nm or less, further 45 nm and 32 nm on a wafer.

(Transfer Properties of Photomask Having Assist Pattern)

The transfer properties of a photomask having an assist pattern are first described while taking a halftone mask as an example before describing a correcting method of the present invention. The inventors of the present invention have examined the transfer properties of a halftone mask having an assist pattern for forming a minute pattern with a half pitch of 45 nm or less on a wafer by simulation while comparing with a binary mask.

In the simulation, EM-Suite (trade name, manufactured by Panoramic Technology Inc.) was used as simulation software for estimating the transfer properties of a mask pattern. The main simulation conditions are the same as the above-mentioned contents described by using FIGS. 3A and 3B.

FIGS. 4A and 4B is an evaluation pattern used for the simulation (FIG. 4A), and a view of an aerial image showing light intensity corresponding to a position of the evaluation pattern (FIG. 4B). The contents of the evaluation pattern are the same as the above-mentioned contents described by using FIGS. 4A and 4B.

In a halftone mask having the above-mentioned assist pattern, transfer properties of the assist pattern (SRAF) at the ends of the line/space pattern are as described above.

FIG. 23 is a view showing a ratio (the vertical axis) of SRAF part light intensity to slice level of normalized light intensity threshold with respect to SRAF CD (the horizontal axis) on a wafer in a halftone mask and a binary mask in the case where film thickness of the main pattern and the assist pattern (SRAF) obtained by the above-mentioned simulation is the same. The halftone mask (a triangular point in the drawing) shows the case where the main pattern CD is of three kinds (32 nm; 36 nm; and 40 nm on a wafer). The above-mentioned ratio of 1 or less causes SRAF to be transferred, so that the above-mentioned ratio needs to be a value more than 1 for not transferring SRAF. When the main pattern CD of the halftone mask shown by a dotted line in the drawing is 32 nm (128 nm on the mask), SRAF is resolved if SRAF CD is not 14 nm (56 nm on the mask) or less.

The above is a simulation result in the case of using the 6%-halftone mask having SRAF, and when the main pattern CD of the halftone mask is as minute as 32 nm, it is found that the SRAF dimension becomes so extremely small that the actual mask production is difficult.

<Correcting Method of Photomask of the Present Invention>

Next, embodiments of a correcting method of a photomask of the present invention are described in detail on the basis of drawings while referring to the above-mentioned results. In describing transfer properties of the following mask pattern, a Cquad pupil filter 31 shown in the above-mentioned FIGS. 3A and 3B was used and EM-Suite (trade name, manufactured by Panoramic Technology Inc.) was used as simulation software. The main simulation conditions are such that an ArF excimer laser (193 nm) is used as an illuminating source and NA is 1.35. The pattern shown in the above-mentioned FIG. 4A is used for an evaluation pattern.

Figure 25A:
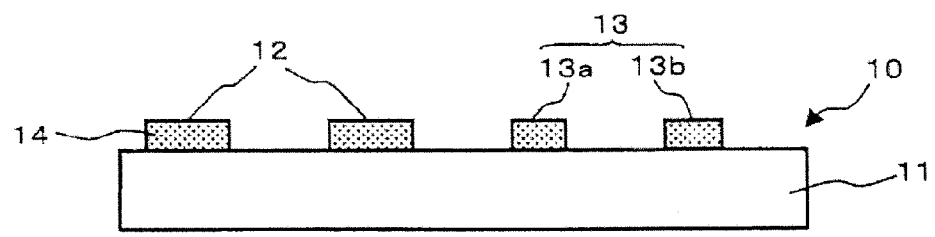
FIGS. 25A to 25C area cross-sectional schematic view showing an embodiment of a correcting method of a photomask having an assist pattern of the present invention.
Figure 25B:
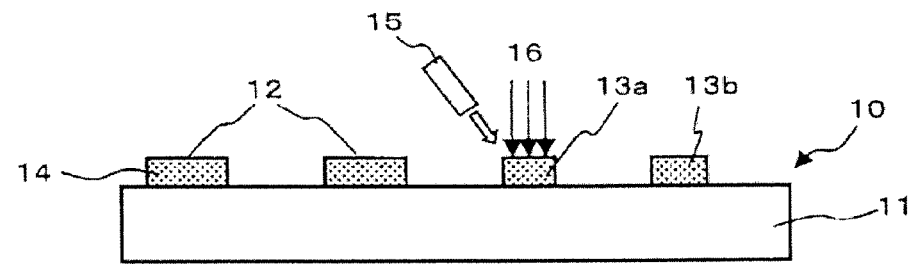
Figure 25C:
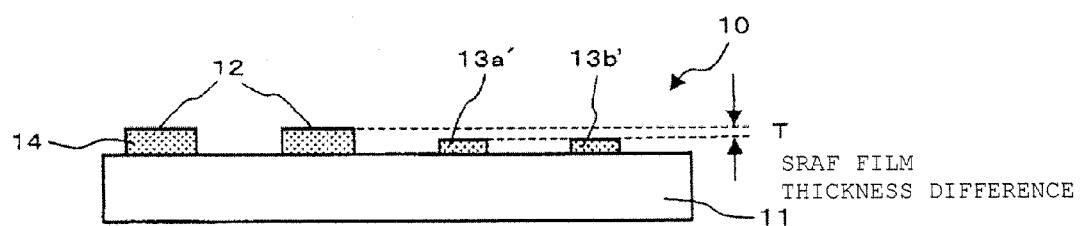

FIGS. 25A to 25C are cross-sectional schematic views showing a process outline of an embodiment of a correcting method of a photomask having an assist pattern of the present invention, and exemplifies the case of a halftone mask provided with a line/space pattern. FIG. 25A is a cross-sectional schematic view of a photomask before being corrected, and is a halftone mask 10 in which a main pattern 12 for transmitting exposing light at a predetermined transmittance to change a phase is provided on a transparent substrate 11 such as a synthetic quartz substrate, the main pattern 12 is composed of a single-layer semi-transparent film 14, and an assist pattern (SRAF) 13 composed of a semi-transparent film with the same film thickness made of the same material as the main pattern 12 is formed nearby the main pattern 12. FIGS. 25A to 25C exemplify only two lines of the main pattern 12 and the assist pattern 13 each and part of a mask pattern, and needless to say, is not limited thereto. The main pattern may be an isolated pattern or a periodic pattern.

The halftone mask 10 having an assist pattern of the present embodiment is determined so that a retardation of 180° is generated between the exposing light transmitting through the main pattern 12 and the exposing light transmitting through a transparent region with no patterns of the transparent substrate 11. The measurement of retardation may be performed by a phase shift amount measuring apparatus (such as MPM193™: manufactured by Lasertec Corporation).

Here, the halftone mask 10 shown in FIG. 25A is a mask which uses an ArF excimer laser as an exposing source, in which assist patterns 13a and 13b nearby the main pattern 12 are resolved on a wafer of a transfer-target surface when the mask pattern is transferred on a wafer by a projection exposure by an off axis illumination.

FIG. 25B is a cross-sectional schematic view showing a state during correction of a photomask in which the above-mentioned assist patterns 13a and 13b are resolved on a wafer. The above-mentioned assist patterns 13a and 13b to be resolved on a transfer-target surface are of properties different from an unnecessary excessive defect not originally allowed to be on the mask, namely, called "black defect", and are an indispensable region to the formation of the mask pattern on a wafer. The assist patterns 13a and 13b to be resolved on a transfer-target surface on the mask may not be detected as a defect by a conventional mask defect inspection device for detecting a black defect. The detection of the assist patterns 13a and 13b to be resolved may be performed by verification with the use of a lithographic simulation microscope such as Aerial Image Measurement System (manufactured by Carl Zeiss, abbreviated as AIMS (registered trademark), also referred to as AIMS hereinafter), and an exposure test with an actual exposure device.

In a correcting method of the present invention, a surface in a corresponding region of the assist patterns 13a and 13b to be resolved on a transfer-target surface is etched or ground to thin the film thickness in a corresponding region of the assist patterns 13a and 13b until the assist patterns 13a and 13b are not resolved on a wafer as a transfer-target surface. FIG. 25B exemplifies the case of correcting by an electron beam mask correcting device in such a manner that a region of the assist pattern 13a to be resolved on a wafer is etched to thin the film thickness.

In the correction, the whole assist pattern plane of a line or plural lines does not always need to be etched to form a thin film, and only a region of the assist pattern to be resolved may be etched to thin the film thickness. Needless to say, in the case where the whole assist pattern plane of a line is transferred, the film thickness of the whole plane of a line may be thinned, and in the case where the whole assist pattern plane of plural lines is transferred, the film thickness of the whole plane of plural lines may be thinned.

In a process of etching or grinding a surface of the above-mentioned assist patterns 13a and 13b to be resolved on a transfer-target surface, film thickness to be removed by etching or grinding the assist pattern 13a may be previously obtained by simulation.

FIG. 25C is a cross-sectional schematic view showing a state of a photomask after being corrected, in which a surface of the assist patterns 13a and 13b to be resolved on a transfer-target surface is etched to thin the film thickness and obtain assist patterns 13a' and 13b'. The correction spot becomes thinner through etching by film thickness difference T than film thickness before being corrected.

In the present invention, various kinds of methods conventionally used for correcting a black defect on a photomask may be applied to a method of thinning film thickness of a region of the above-mentioned assist pattern to be resolved on a transfer-target surface. Examples thereof include a gas-assisted etching method by using an ion beam of a focused ion beam (FIB) mask correcting device, a gas-assisted etching method by using an electron beam (EB) of an electron beam (EB) mask correcting device as shown in the above-mentioned FIG. 25B, a method of physically grinding an assist pattern having a defect by using a probe of an atomic force microscope (AFM), or a method in such a manner that a resist pattern is formed on a mask to expose only a defective region of an assist pattern and thin the film thickness of the defective region is selectively obtained by dry-etching.

However, with regard to the gas-assisted etching method by an FIB mask correcting device among the above-mentioned methods, a phenomenon of a gallium stain such that gallium ordinarily used as an ion beam is driven into a transparent substrate causes light transmittance in a correction site to be decreased, or a digging phenomenon of a transparent substrate called a river bed by overetching occurs easily in a transparent substrate on the periphery of a correction site. The method of forming a resist pattern requires processes of resist application, pattern drawing and resist peeling, and causes a problem such that a correction process is extended.

On the other hand, the gas-assisted etching method by an EB mask correcting device is, for example, as shown in FIG. 25B, a method in such a manner that assist gas most suitable for etching is discharged from a gas nozzle 15 nearby an electron beam 16 for intensively scanning the assist pattern 13a having a defect, a molecule of the gas adheres to the assist pattern 13a surface to be corrected, and a chemical reaction is caused by the electron beam to perform etching while changing the assist pattern material into a volatile substance, which method is suitable for a minute pattern and does not damage a correction spot. The confirmation of a correction spot is performed by SEM provided for an EB mask correcting device. Examples of the above-mentioned EB mask correcting device include MeRiT 65™ (manufactured by Carl Zeiss).

The method of grinding with a probe of AFM is a method of directly shaving off a defect while applying a certain load to a hard probe such as a diamond needle, in which the probe is set at the tip of a cantilever to control the cantilever by using the principle of an atomic force microscope. The confirmation of a correction spot is performed by SEM provided for AFM, and the method is such that the assist pattern surface having a defect to be corrected is scanned by the probe to subsequently shaving off the defect itself with the probe. The method is suitable for correcting a minute pattern and the case where area and the film thickness to be removed are small. Examples of the above-mentioned mask correcting device with the use of a probe of AFM include RAVEnm 650™ (manufactured by RAVE LLC).

Accordingly, in the present invention, a method of thinning the film thickness of the assist pattern with a minute pattern formed is more preferably the above-mentioned gas-assisted etching method by an EB mask correcting device or method of grinding with a probe of AFM.

In the present invention, as shown in FIG. 25C, film thickness difference T (SRAF film thickness difference in the drawing) between the film thickness of the assist patterns 13a' and 13b' after being corrected by etching or grinding to thin and the film thickness of the assist patterns 13a and 13b before being corrected is preferably within the scope of 1 nm to 40 nm. The film thickness may be measured by an atomic force microscope (AFM).

The assist pattern is originally designed and produced into such a mask as not to be resolved on a transfer-target surface, so that the assist pattern to be transferred on a wafer is frequently part thereof and the film thickness to be corrected is frequently very thin. Accordingly, the film thickness to be corrected is occasionally slight and the lower limit of film thickness to be corrected is determined at correctable 1 nm in the present invention. The reason therefor is that the film thickness to be corrected of less than 1 nm does not allow the effect of correcting to be confirmed. On the other hand, the upper limit of film thickness to be corrected is determined at 40 nm in the properties of the assist pattern. The reason therefor is that the film thickness to be corrected of more than 40 nm reduces or extinguishes original SRAF functions such as the effect of improving resolution of the main pattern and the focal depth magnification effect by SRAF.

(Photomask to which Correcting Method of the Present Invention is Applicable)

A correcting method of a photomask of the present invention may be used for either mask of a halftone mask and a binary mask if they have an assist pattern, is not particularly limited, and is described while exemplifying a typical mask of a halftone mask and a binary mask having an assist pattern in FIGS. 26A to 26F. In FIGS. 26A to 26F, the same reference numerals are used in the case of showing the same site. Needless to say, a correcting method of a photomask of the present invention is not limited to the photomask shown in FIGS. 26A to 26F.

FIGS. 26A to 26D are partial cross-sectional schematic views showing an example of a halftone mask, such that a main pattern and an assist pattern are composed of a semi-transparent film, to which a correcting method of the present invention is applicable. With regard to the photomasks of FIGS. 26A to 26D, a main pattern 42 and an assist pattern 43 are provided on a transparent substrate 41, and in any mask, film thickness of the main pattern 42 is determined so as to generate a retardation of 180° between the exposing light transmitting through the main pattern 42 and the exposing light transmitting through a transparent region of the transparent substrate 41.

Figure 26A:
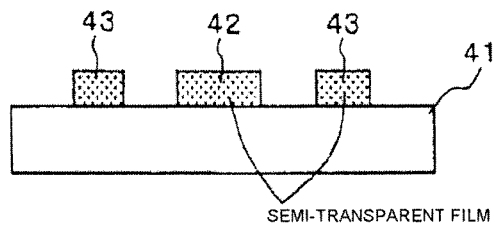
FIGS. 26A to 26F are a partial cross-sectional schematic view showing an example of a photomask having an assist pattern to which a correcting method of the present invention is applicable.
Figure 26B:
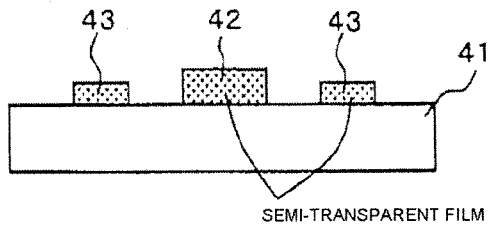
Figure 26C:
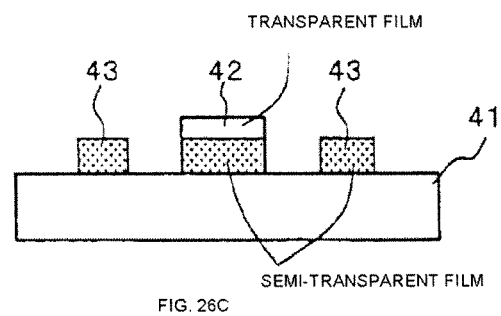
Figure 26D:
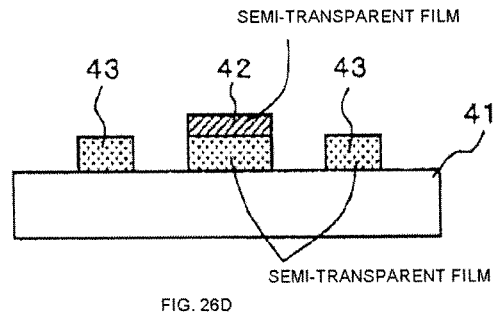

In addition, FIG. 26A is a halftone mask such that the main pattern 42 and the assist pattern 43 are composed of the same semi-transparent film with the same film thickness. FIG. 26B is a mask such that the main pattern 42 and the assist pattern 43 are composed of the same semi-transparent film, and a predetermined retardation within the scope of 70° to 115° is generated between the exposing light transmitting through the assist pattern 43 and the exposing light transmitting through a transparent region of the transparent substrate 41, in which the film thickness of the assist pattern 43 is thinner than that of the main pattern 42. FIG. 26C is a mask such that the main pattern 42 is composed of two layers of a transparent film/a semi-transparent film, and the assist pattern 43 is composed of a semi-transparent film, in which the main pattern 42 and the assist pattern 43 are the same in the film thickness of the semi-transparent film layer. FIG. 26D is a mask such that the main pattern 42 is composed of two layers of a semi-transparent film/a semi-transparent film, and the assist pattern 43 is composed of a semi-transparent film, in which the main pattern 42 and the assist pattern 43 are the same in film thickness of the semi-transparent film layer contacting with the transparent substrate 41.

The above-mentioned masks having the assist pattern shown in FIGS. 26A to 26D are typical examples, and examples of a mask to which a correcting method of the present invention is applicable include a mask such that the main pattern and the assist pattern are composed of two layers of a semi-transparent film/a semi-transparent film.

Figure 26E:
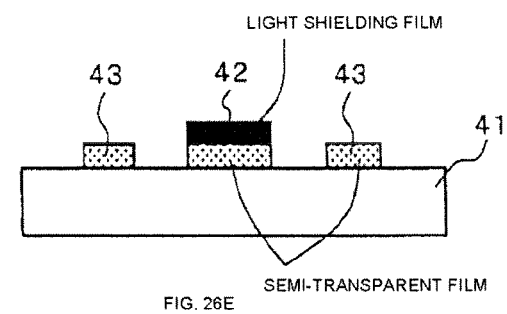
Figure 26F:
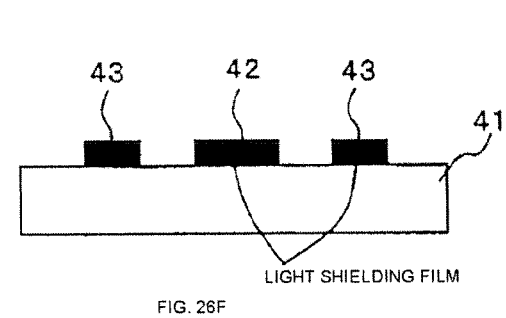

FIGS. 26E and 26F are partial cross-sectional schematic views showing an example of a binary mask such that a main pattern is composed of a light shielding film for shielding exposing light. FIG. 26E is a mask such that the main pattern 42 is composed of two layers of a light shielding film/a semi-transparent film on the transparent substrate 41, and the assist pattern 43 is composed of a semi-transparent film, in which the main pattern 42 and the assist pattern 43 are the same in film thickness of the semi-transparent film layer. FIG. 26F is a mask such that the main pattern 42 and the assist pattern 43 are composed of the same light shielding film with the same film thickness.

As described above, a semi-transparent film of the main pattern and the assist pattern in the photomask to which a correcting method of the present invention is applied signifies a semi-transparent thin film for transmitting exposing light at a predetermined transmittance, which thin film may be a semi-transparent single-layer film, or a constitution of a two-layer film or more of a semi-transparent film and a transparent film or another semi-transparent film different in transmittance. Also, a light shielding film of the main pattern and the assist pattern in the photomask to which a correcting method of the present invention is applied signifies a thin film for shielding exposing light, which thin film may be a single-layer film of a light shielding film, or a constitution of a two-layer film or more having a light shielding film and a semi-transparent film.

In a correcting method of a photomask of the present invention, a material for a semi-transparent film composing the main pattern 42 and the assist pattern 43 of the masks shown in FIGS. 26A to 26E is not particularly limited, and examples thereof include semi-transparent films such as a molybdenum silicide oxide film (MoSiO), a molybdenum silicide nitride film (MoSiN) and a molybdenum silicide oxide nitride film (MoSiON), which are molybdenum silicide-based materials, semi-transparent films such as a chromium oxide film (CrO), a chromium nitride film (CrN) and a chromium oxide nitride film (CrON), which are chromium-based materials, and a semi-transparent film such as tin oxide ($SnO_2$). The molybdenum silicide-based semi-transparent films are put to practical use as a halftone mask material and are more preferable materials. Examples of a transparent film composing the main pattern 42 shown in FIG. 26C include a silicon oxide film ($SiO_2$). Examples of a light shielding film composing the main pattern 42 shown in FIG. 26E and a light shielding film composing the main pattern 42 and the assist pattern 43 of the mask shown in FIG. 26F include a metal thin film such as a chromium film (Cr) and a metal silicide thin film such as molybdenum silicide (MoSi).

In the gas-assisted etching process by using an electron beam of the electron beam mask correcting device shown in FIG. 25B, in the case where the semi-transparent film composing the main pattern 42 and the assist pattern 43 is a semi-transparent film made of molybdenum silicide-based materials, film thickness of the assist pattern may be selectively thinned by selectively etching with the use of fluorine-based gas such as $CF_4$, $CHF_3$ and $C_2F_6$, or mixed gas thereof, or gas, with which oxygen is mixed, as assist gas. In the case where the light shielding film composing the main pattern 42 and the assist pattern 43 is made of chromium, film thickness of the assist pattern may be selectively thinned by selectively etching with the use of mixed gas of $Cl_2$ and oxygen as assist gas.

(Transfer Properties of Assist Pattern after being Corrected)

Next, the effect of thin-film forming by a correcting method of a photomask of the present invention shown in FIGS. 25A to 25C, such that an assist pattern (SRAF) surface is etched or ground to thinly correct the film thickness of the assist pattern, is described. The mask is described while taking a halftone mask in the shape of a partial cross-sectional schematic view shown in FIG. 26A as an example, such that molybdenum silicide with a film thickness of 68 nm is used as a semi-transparent film, a main pattern (a film thickness of 68 nm) has ArF excimer laser light (193 nm) transmittance of 6% and a retardation of 180° with a transparent region of a transparent substrate, and film thickness of the assist pattern before being corrected is also 68 nm.

EM-Suite (trade name, manufactured by Panoramic Technology Inc.) was used as simulation software. The main simulation conditions were such that an ArF excimer laser (193 nm) was used as an illuminating source, NA was 1.35, and a Cquad pupil filter was used as an off axis illumination; a Cquad 21 was such that an angular aperture of a fan-shaped light transmission part was 35°, an outside diameter was 0.9, and an inside diameter was 0.7 (a radius of the pupil filter is regarded as 1). The mask adopted values of the above-mentioned halftone mask.

FIG. 5 is a result obtained by the simulation and a view showing a relation between SRAF film thickness difference (the horizontal axis) and SRAF light intensity/slice level of normalized light intensity threshold (the vertical axis) in changing CD of SRAF in the above-mentioned halftone mask such that CD of the main pattern on a wafer is 32 nm. In FIG. 5, it is shown that SRAF is resolved on a wafer unless SRAF light intensity/slice level is 1 or more.

As shown in FIG. 5, when CD of SRAF is as minute as 14 nm (56 nm on a mask), even though SRAF film thickness difference after being corrected is the same as 0 (the same as the case of not being corrected), SRAF light intensity/slice level is 1 or more and SRAF is not essentially transferred. Next, when CD of SRAF is 22 nm (88 nm on a mask), it is shown that SRAF is not resolved and transferred if SRAF film thickness difference after being corrected is 24 nm or more. Similarly, when CD of SRAF is 26 nm (104 nm on a mask), SRAF is not transferred if SRAF film thickness difference after being corrected is 30 nm or more, and when CD of SRAF is 30 nm (120 nm on a mask), SRAF is not transferred if SRAF film thickness difference after being corrected is 34 nm or more.

As described in the above-mentioned FIGS. 5 and 23, in a halftone mask such that the main pattern and the assist pattern (SRAF) are composed of the same material and the same film thickness, when CD of the main pattern is determined at 32 nm, SRAF is used only if CD of SRAF is 14 nm or less; however, as described above, the application of a correcting method of the present invention such that SRAF to be transferred is formed into a thin film allows SRAF to be also used without being resolved and transferred even though CD of SRAF is enlarged to approximately twice large dimension, that is, 26 nm to 30 nm. A correcting method of the present invention extends the availability of a halftone mask having SRAF which is conventionally difficult to be micronized and used.

Next, the influence in thinning SRAF by correcting is described. FIG. 6 is a view showing a relation between line CD and Defocus (focal position change) at a main pattern end on a wafer in changing CD of SRAF obtained by the simulation. The film thickness difference from the film thickness before being corrected (SRAF film thickness difference: 24 nm, 32 nm and 40 nm) is offered by correcting through etching to thin the film thickness so that SRAF is not resolved with respect to each CD of SRAF. As shown in FIG. 6, CD of SRAF is enlarged to 22 nm to 30 nm (on a wafer) to perform correction for thinning the film thickness of SRAF, so that approximately the same tendency is exhibited without any CD change among each of SRAF dimensions when the focus is changed. That is to say, it is shown that the formation of SRAF into a thin film by a correcting method of the present invention has no bad influence on Defocus to allow the same dimensional accuracy as the case of uncorrected SRAF CD of 14 nm.

In the above-mentioned embodiments, the photomask having the assist pattern (SRAF) was described while taking a mask aspect having SRAF at both ends of the main pattern as an example; yet, the present invention is not limited thereto and a correcting method of a photomask of the present invention may be also applied to a mask aspect having SRAF between the main patterns or a mask aspect having an isolated pattern as the main pattern.

According to a correcting method of a photomask of the present invention, in a correcting method of a photomask in the case where an assist pattern is resolved and transferred on a transfer-target surface, a surface of the assist pattern is etched or ground to thin the film thickness of the assist pattern until the assist pattern is not resolved on a transfer-target surface, so that a problem such that the assist pattern is resolved and transferred may be solved to correct to a photomask for forming a transferred image having high contrast while keeping the focal depth magnification effect as the assist pattern. The correcting method of a photomask of the present invention differs from a conventional correcting method of a photomask such that a mask pattern is corrected in the line width direction of the assist pattern, is a method of correcting a mask pattern in the thickness direction of the assist pattern, and allows a photomask having the assist pattern to be corrected by a sure and comparatively easy method.

E. Corrected Photomask

<Corrected Photomask of the Present Invention>

A corrected photomask of the present invention is a photomask such that an assist pattern is corrected by the above-mentioned correcting method of a photomask, as an example, which is provided with the assist patterns 13a' and 13b' after being corrected by etching or grinding to thin, and has the film thickness difference (SRAF film thickness difference in the drawing: T) from film thickness of the assist patterns before being corrected, as shown in FIG. 25C. In a photomask of the present invention, with regard to the photomask in which an assist pattern is resolved and transferred to a transfer-target surface, the assist pattern is corrected in the thickness direction of film thickness, so that the assist pattern is not resolved and transferred to a transfer-target surface and a transferred image having high contrast may be formed while keeping the focal depth magnification effect.

The present invention is hereinafter described by examples.

EXAMPLES

An MoSi-based halftone mask having an assist pattern and a transmittance of 6% at 193 nm was produced as a mask for an ArF excimer laser (a wavelength of 193 nm). A pattern shown in FIGS. 4A and 4B was formed on the conditions that a target line dimension on a wafer was 45 nm and the pattern was a line/space repetition pattern with a pitch of 90 nm (a pitch of 360 nm on the mask). Nine line/space with a half pitch of 45 nm as a main pattern and two SRAF (the pitch of SRAF is 90 nm) at both ends of the main pattern for improving resolution of the main pattern at the ends are put on a wafer. Both the main pattern and SRAF were composed of the above-mentioned 6%-halftone and film thickness of both patterns on the mask was determined at 68 nm. Both CD of the main pattern and CD of SRAF on the mask were determined at 128 nm.

ArF excimer laser exposure was performed by using the above-mentioned halftone mask. NA in the exposure system was 1.35 and a Cquad pupil filter shown in FIGS. 3A and 3B was used as an off axis illumination. However, the problem was caused such that the SRAF pattern, which may not be transferred on a wafer, was resolved on a wafer.

Thus, in order to etch or grind SRAF to thin the film thickness thereof, transfer properties were previously estimated by simulation. The transfer properties to a wafer in thinning the film thickness of SRAF were verified by using a lithographic simulation microscope AIMS45-193i™ (manufactured by Carl Zeiss) on the same exposure conditions as the above-mentioned exposure system.

First, the etching conditions of SRAF were confirmed by a test sample. The pattern was a line/space pattern with a pitch of 360 nm on the mask (90 nm on a wafer), and two SRAF were provided at both ends of the main pattern. FIG. 27 is an SEM plane photograph after gas-assisted etching was performed by using $CF_4$ as assist gas with the use of an EB mask correcting device MeRiT 65™ (manufactured by Carl Zeiss) to partially etch an SRAF part (S1 and S2) of an MoSi thin film on a quartz substrate by 30 nm. A region inside the broken line of FIG. 27 is a part formed into a thin film by etching, and a slight difference is microscopically confirmed in the SEM photograph between the etched region and the unetched region, which etched region shows a favorable surface state.

FIG. 28 is a verification image by a lithographic simulation microscope AIMS (AIMS45-193i™, manufactured by Carl Zeiss) after partially etching an SRAF part (S1 and S2) by 30 nm in the above-mentioned test sample, and shows a planar state of light intensity distribution on a wafer. A region inside the broken line of FIG. 28 corresponds to the SRAF part formed into a thin film by etching, and it is shown that light intensity of this part increases and the resist pattern is not resolved.

Figure 29:
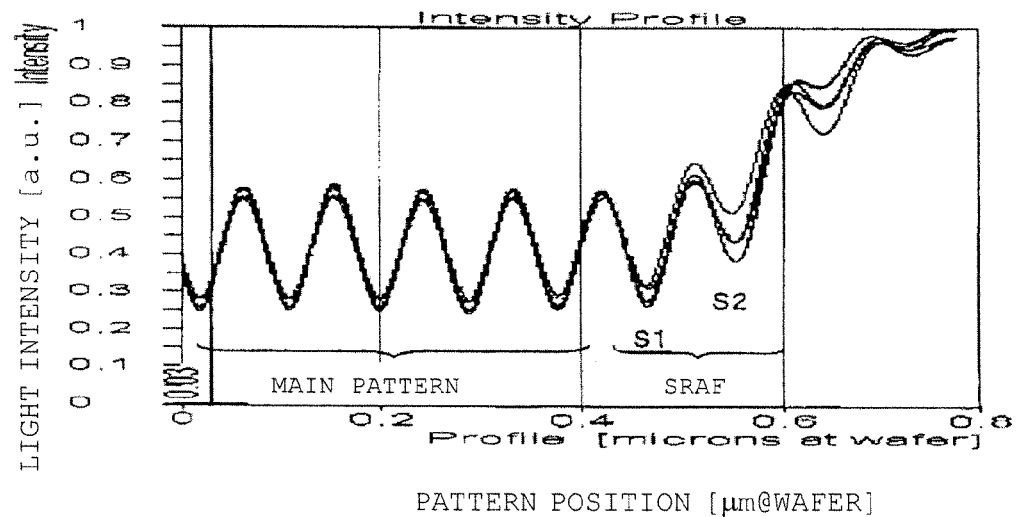
FIG. 29 is a view of an aerial image showing a relation between a pattern position and light intensity of an SRAF part before being formed into a thin film in Examples.

The verification results of transfer properties by simulation with the use of AIMS are shown in FIGS. 29 to 34. FIG. 29 is a view of an aerial image showing light intensity corresponding to a position of the mask pattern before thinning SRAF, and SRAF (S1, S2) on one side of a pair of pattern both ends and part of the main pattern are shown. In FIG. 29, the horizontal axis shows a position of part of the main pattern and a pair of the pattern of SRAF, and the vertical axis shows normalized light intensity when light intensity of a transmission part with no patterns is regarded as 1. The indication of plural light intensity profiles shows the case of changing focus (focal depth) for watching the effect of SRAF. As shown in FIG. 29, it was shown that 51 of SRAF was resolved on a wafer even though slice level was any within the scope of 0.25 to 0.57 in light intensity, and S2 was also resolved when slice level was 0.4 or more.

Figure 30:
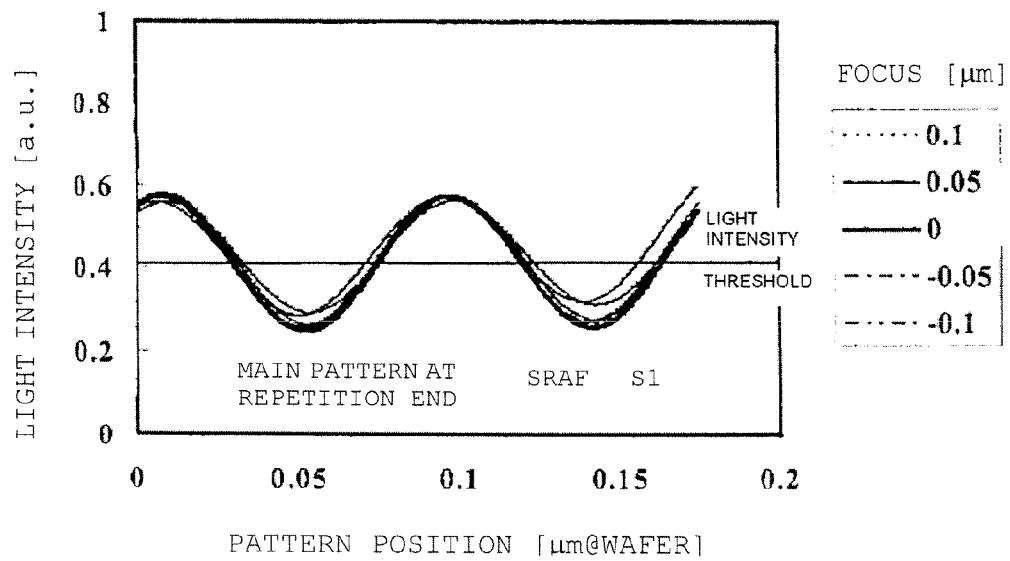
FIG. 30 is a partial magnified view of FIG. 29 and is a view of an aerial image showing a relation between a pattern position and light intensity of a main pattern at a repetition end and an assist pattern S1 before forming SRAF into a thin film.

FIG. 30 is a partial magnified view of FIG. 29 and a view of an aerial image showing a relation between a pattern position and light intensity of the main pattern at a repetition end and the assist pattern 51 before forming SRAF into a thin film in changing focus. The light intensity threshold such that CD of the main pattern of a line/space repetition part was 45 nm was regarded as 0.42. In FIG. 30, as described in FIG. 29, five light intensity profiles in the case of changing focus for watching the effect of SRAF are shown. As shown in FIG. 30, S1 of SRAF is resolved regardless of the focus.

Figure 31:
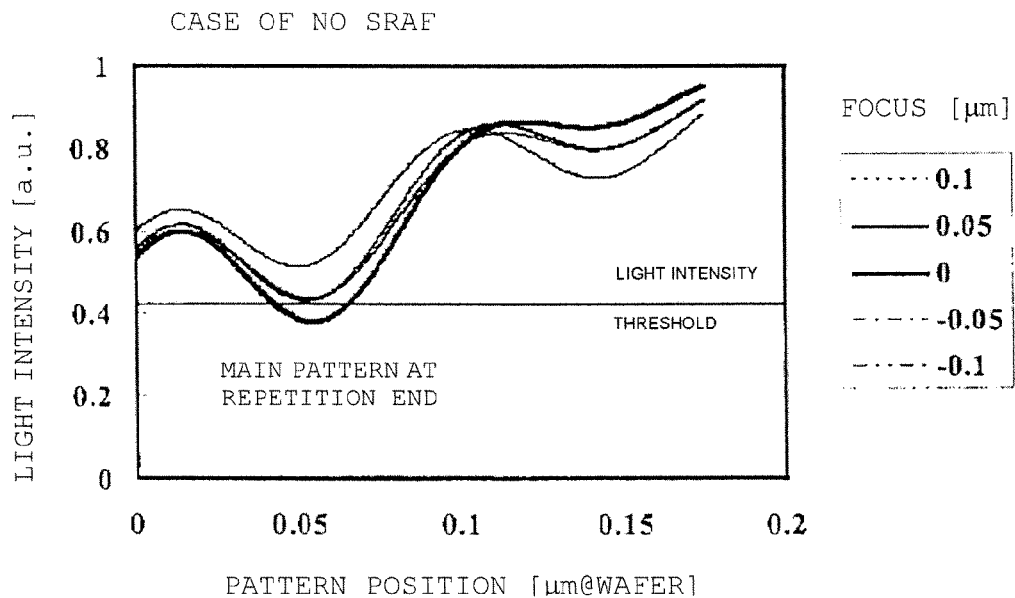
FIG. 31 is a comparison reference view with respect to FIG. 30 and is a view of an aerial image showing a relation between a pattern position and light intensity of a main pattern at a repetition end and an assist pattern S1 in the case of no SRAF.

Here, FIG. 31 is a view of an aerial image showing a relation between a pattern position and light intensity of the main pattern at a repetition end and the assist pattern S1 in the case of no SRAF, as a comparison reference of FIG. 30. As shown in FIG. 31, in the case of no SRAF, the main pattern at a repetition end is scarcely resolved.

Figure 32:
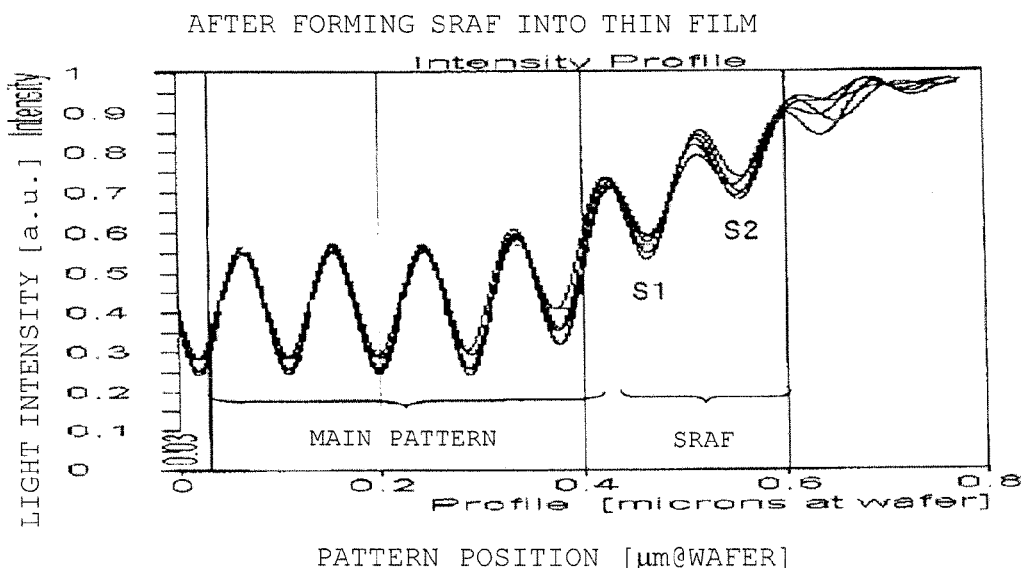
FIG. 32 is a view of an aerial image showing a relation between a pattern position and light intensity of an SRAF part after being formed into a thin film in Examples.

Next, transfer properties in the case of forming SRAF into a thin film by correcting were estimated by simulation. FIG. 32 is an estimation result of transfer properties by simulation and a view of an aerial image showing light intensity corresponding to a position of the mask pattern after thinning SRAF by 30 nm. The formation of SRAF into a thin film increased light amount by SRAF to increase the minimum value of light intensity of SRAF; it was shown that the SRAF pattern was not resolved within the scope of 0.25 to 0.55, and the margin for selecting slice level of light intensity extended. It was confirmed that the optical image of the main pattern did not deteriorate even though SRAF was formed into a thin film.

Figure 33:
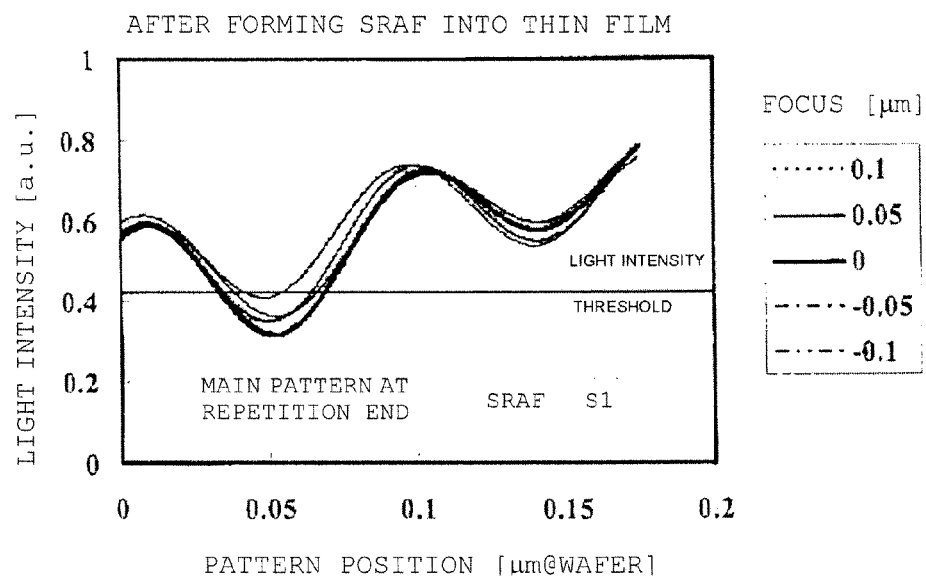
FIG. 33 shows a situation of FIGS. 27 and 28 inside a broken line, and is a partial magnified view of FIG. 32 while is a view of an aerial image showing a relation between a pattern position and light intensity of a main pattern at a repetition end and an assist pattern S1 after forming SRAF into a thin film.

FIG. 33 shows a situation of FIGS. 27 and 28 inside a broken line, and is a partial magnified view of FIG. 32 and a view of an aerial image showing a relation between a pattern position and light intensity of the main pattern at a repetition end and the assist pattern S1 after forming SRAF into a thin film. In FIG. 33, light intensity profiles in the case of changing focus for watching the effect of SRAF are shown. As shown in FIG. 33, the formation of SRAF into a thin film allows S1 of SRAF not to be resolved.

Figure 34:
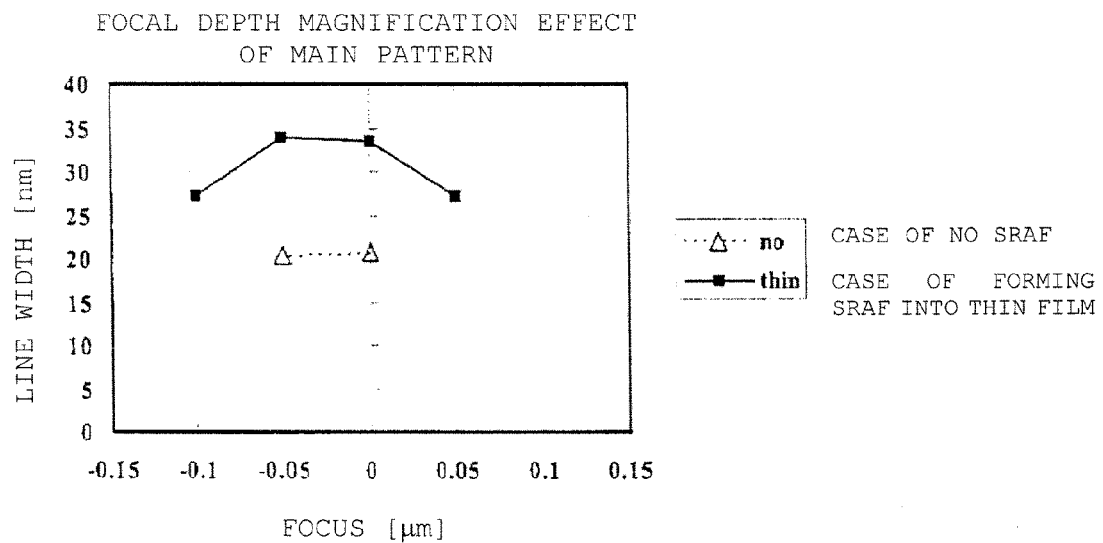
FIG. 34 is a view showing focal depth of a main pattern at a repetition end by forming SRAF into a thin film.

FIG. 34 is a view showing focal depth of the main pattern at a repetition end after forming SRAF into a thin film. As described above, the light intensity [a.u.] threshold such that CD of the main pattern of a line/space repetition part was 45 nm was regarded as 0.42. For comparison, the case of no SRAF is also shown in the drawing. It was shown that the focus scope to be resolved was narrow in the case (no) of no SRAF and the focus scope to be resolved was wide in the case (thin) of providing SRAF formed into a thin film. Also, it was shown that the effect as SRAF was kept while not resolving SRAF.

The SRAF part of the above-mentioned halftone mask having the SRAF pattern to be resolved on a wafer was corrected on the basis of the above-mentioned etching test results and simulation results. The whole surface of two SRAF on each side of a pair of the main pattern ends was etched on the same etching conditions as the above-mentioned test sample and formed into a thin film until the film thickness difference from the initial film thickness became 30 nm.

When ArF excimer laser exposure was performed again by using the halftone mask corrected by thinning film thickness of the above-mentioned SRAF, SRAF was not resolved at all and only the main pattern was transferred with high resolution on a wafer. Also, the focal depth magnification effect during exposure was obtained.

REFERENCE SIGNS LIST 10, 20 halftone mask
11, 21 transparent substrate
12, 22 main pattern
13, 13a, 13a', 13b, 13b', 23 assist pattern (SRAF)
14 semi-transparent film
15 gas nozzle
16 electron beam
24 lower-layer semi-transparent film (etch stop layer)
25 upper-layer semi-transparent film
31, 161 pupil filter
32, 162 illuminating light
33, 163 mask
41 transparent substrate
42 main pattern
43 assist pattern (SRAF)
164 mask pattern
165 main pattern
166 SRAF
70, 80, 90, 100 halftone mask
71, 81, 91, 101 transparent substrate
72, 82, 102 semi-transparent film
73, 83, 93, 103 light shielding film
74, 84 first resist pattern
75, 85, 95 main pattern part
76, 86, 96 assist pattern part
77, 87 second resist pattern
78, 88, 98 assist pattern
79, 89, 99 main pattern
92a lower-layer semi-transparent film (etch stop layer)
92 upper-layer semi-transparent film
94a first resist pattern
94b second resist pattern
94c third resist pattern
104 light shielding film
105 resist pattern for light shielding region
110 halftone mask of conventional manufacturing method
111 transparent substrate
112 semi-transparent film
113 light shielding film
114 first resist pattern
115 main pattern part
116 assist pattern part
117 second resist pattern
118 assist pattern
119 main pattern
121 level difference on transparent substrate surface
1 main pattern
2 semi-transparent assist pattern
301 transparent substrate
302 semi-transparent film
304 transparent film

The invention claimed is:

1. A halftone phase shifting mask using an ArF excimer laser as an exposing source, being used for a projection exposure by an off axis illumination, and comprising on a principal plane of a transparent substrate a main pattern transferred to a transfer-target surface by the projection exposure and an assist pattern formed nearby the main pattern, where the assist pattern is not transferred to the transfer-target surface and a minimum pattern pitch of the main pattern on the transfer-target surface is a pitch of 120 nm or less;

wherein the main pattern and the assist pattern are each constituted from a semi-transparent film made of a same material; and a first retardation of 180° is generated between a first light transmitting through the main pattern and a second light transmitting through a transparent region of the transparent substrate, and a predetermined second retardation within a scope of 70° to 115° is generated between a third light transmitting through the assist pattern and the second light transmitting through the transparent region of the transparent substrate.

2. The halftone phase shifting mask according to claim 1, wherein a first film thickness of the assist pattern is thinner than a second film thickness of the main pattern, in between which there is a predetermined film thickness difference within a scope of 24 nm to 40 nm.

3. The halftone phase shifting mask according to claim 2, wherein the film thickness difference is formed by dry-etching.

4. The halftone phase shifting mask according to claim 1, wherein an exposing light transmittance of the assist pattern is a predetermined transmittance within a scope of 15% to 29%.

5. The halftone phase shifting mask according to claim 1, wherein the semi-transparent film made of the same material is a single-layer semi-transparent film or a two-layer semi-transparent film.

6. The halftone phase shifting mask according to claim 5, wherein the single-layer semi-transparent film is a semi-transparent film made of a molybdenum silicide-based material, and the two-layer semi-transparent film is such that a semi-transparent film made of a chromium-based material and a semi-transparent film made of a molybdenum silicide-based material are sequentially provided on the transparent substrate.

7. The halftone phase shifting mask according to claim 1, wherein a light shielding region is formed in an outer periphery of the halftone phase shifting mask.

8. The halftone phase shifting mask according to claim 1, wherein both the main pattern and the assist pattern are line patterns, and the main pattern is an isolated pattern or a periodic pattern.

9. A manufacturing method of a halftone phase shifting mask using an ArF excimer laser as an exposing source, being used for a projection exposure by an off axis illumination, and comprising on a principal plane of a transparent substrate a main pattern transferred to a transfer-target surface by the projection exposure and an assist pattern formed nearby the main pattern, where the assist pattern is not transferred to the transfer-target surface and the minimum pitch of the main pattern on the transfer-target surface is 120 nm or less;

wherein the manufacturing method comprises steps of:
(a) forming a semi-transparent film and a light shielding film sequentially on the principal plane of the transparent substrate to obtain a first film thickness for allowing a first retardation of approximately 180° between a first light transmitting through the semi-transparent film and a second light transmitting through a transparent region of the transparent substrate;
(b) forming a first resist pattern on the light shielding film to form a main pattern part and an assist pattern part by sequentially dry-etching the light shielding film and the semi-transparent film;
(c) peeling off the first resist pattern to subsequently form a second resist pattern on a part of the light shielding film and removing the light shielding film from the assist pattern part by etching;
(d) peeling off the second resist pattern to subsequently dry-etch a whole of the principal plane of the transparent substrate and forming the assist pattern by dry-etching the semi-transparent film of the assist pattern part until a film thickness for allowing a predetermined second retardation within a scope of 70° to 115° is obtained between a third light transmitting through the assist pattern and the second light transmitting through the transparent region of the transparent substrate; and
(e) removing the light shielding film from the main pattern part by etching to form the main pattern and generate the first retardation of 180° between a fourth light transmitting through the main pattern and the second light transmitting through the transparent region of the transparent substrate.

10. The manufacturing method of the halftone phase shifting mask according to claim 9, wherein the dry-etching of the semi-transparent film in the step (d) is half-etching up to a halfway stage of the first film thickness of the semi-transparent film.

11. The manufacturing method of the halftone phase shifting mask according to claim 9, wherein a film thickness difference between a first thickness of the main pattern and a second thickness of the assist pattern is a predetermined film thickness difference within a scope of 24 nm to 40 nm.

12. The manufacturing method of the halftone phase shifting mask according to claim 9 further comprising a step of forming a third resist pattern for protecting a light shielding region in an outer periphery of the halftone phase shifting mask after the step (d) of forming the assist pattern and the light shielding region at a same time of removing a part of the light shielding film from the main pattern by dry-etching to form the main pattern.

* * * * *